(12) United States Patent
Na

(10) Patent No.: US 9,466,647 B2
(45) Date of Patent: Oct. 11, 2016

(54) FLAT PANEL DISPLAY DEVICE AND METHOD OF MANUFACTURING THE SAME

(71) Applicant: Samsung Display Co., Ltd., Yongin-si, Gyeonggi-do (KR)

(72) Inventor: Sang-Nam Na, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 13 days.

(21) Appl. No.: 13/792,021

(22) Filed: Mar. 9, 2013

(65) Prior Publication Data

US 2014/0014919 A1    Jan. 16, 2014

(30) Foreign Application Priority Data

Jul. 16, 2012   (KR) .......................... 10-2012-0077362

(51) Int. Cl.
*H01L 27/32*     (2006.01)
*H01L 51/56*     (2006.01)
*H01L 51/50*     (2006.01)

(52) U.S. Cl.
CPC ......... *H01L 27/3241* (2013.01); *H01L 27/326* (2013.01); *H01L 27/3211* (2013.01); *H01L 51/5012* (2013.01); *H01L 51/56* (2013.01)

(58) Field of Classification Search
CPC ............... H01L 27/3241; H01L 51/56; H01L 51/5012; H01L 27/3211; H01L 27/326; H01L 27/3216
USPC ......................................................... 257/40
See application file for complete search history.

(56) References Cited

U.S. PATENT DOCUMENTS 6,274,198 B1    8/2001  Dautartas
6,371,451 B1    4/2002  Choi
(Continued)

FOREIGN PATENT DOCUMENTS

EP      1 413 644 A2    4/2004
EP      1 518 940 A1    3/2005
(Continued)

OTHER PUBLICATIONS

Patent Abstracts of Japan and English Machine Translation of JP 11-144865, 32 pages.
(Continued)

*Primary Examiner* — Thao X Le
*Assistant Examiner* — Laura Dykes
(74) *Attorney, Agent, or Firm* — Lewis Roca Rothgerber Christie LLP

(57) ABSTRACT

A flat panel display device includes: a substrate; an insulating layer having first, second, and third openings; a plurality of first lines on the insulating layer overlapped with the first openings, extending in a first direction, and including a first organic light-emitting layer; a plurality of second lines on the insulating layer overlapped with the second openings, extending in the first direction, and including a second organic light-emitting layer that is different from the first organic light-emitting layer; and a plurality of third lines on the insulating layer overlapped with the third openings, extending in the first direction, and including a third organic light-emitting layer that is different from the first and second organic light-emitting layers. Adjacent first and second lines are partially overlapped with each other, and the first, second, and third lines are not overlapped with the openings overlapped with other ones of the lines.

12 Claims, 16 Drawing Sheets

(56) References Cited

U.S. PATENT DOCUMENTS

| | | |
|---|---|---|
| 6,443,597 B1 | 9/2002 | Natori |
| 6,541,130 B2 | 4/2003 | Fukuda |
| 6,749,906 B2 | 6/2004 | Van Slyke |
| 6,995,035 B2 | 2/2006 | Cok et al. |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 2001/0006827 A1 | 7/2001 | Yamazaki et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0122140 A1 | 7/2003 | Yamazaki et al. |
| 2003/0168013 A1 | 9/2003 | Freeman et al. |
| 2003/0183830 A1* | 10/2003 | Yamazaki et al. ............... 257/90 |
| 2003/0221614 A1 | 12/2003 | Kang et al. |
| 2003/0232563 A1 | 12/2003 | Kamiyama et al. |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0160170 A1 | 8/2004 | Sato et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2005/0186330 A1 | 8/2005 | Kim et al. |
| 2006/0066231 A1 | 3/2006 | Nishikawa et al. |
| 2006/0144325 A1 | 7/2006 | Jung et al. |
| 2006/0174829 A1 | 8/2006 | An et al. |
| 2006/0205101 A1 | 9/2006 | Lee et al. |
| 2006/0221092 A1* | 10/2006 | Noguchi et al. ............... 345/589 |
| 2006/0244696 A1 | 11/2006 | Jung et al. |
| 2007/0075955 A1 | 4/2007 | Jung et al. |
| 2007/0077358 A1 | 4/2007 | Jeong et al. |
| 2007/0126342 A1* | 6/2007 | Kaneko et al. ............... 313/503 |
| 2007/0178708 A1 | 8/2007 | Ukigaya |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0258608 A1* | 10/2008 | Chao et al. .................... 313/504 |
| 2009/0001882 A1 | 1/2009 | Park et al. |
| 2009/0017192 A1 | 1/2009 | Matsuura |
| 2009/0232976 A1 | 9/2009 | Yoon et al. |
| 2009/0269881 A1 | 10/2009 | Furuta et al. |
| 2009/0302750 A1 | 12/2009 | Jun et al. |
| 2010/0090594 A1 | 4/2010 | Choi et al. |
| 2010/0328197 A1 | 12/2010 | Lee et al. |
| 2011/0052791 A1 | 3/2011 | Jo et al. |
| 2011/0068331 A1 | 3/2011 | Koh et al. |
| 2011/0165327 A1 | 7/2011 | Park et al. |
| 2011/0266944 A1 | 11/2011 | Song et al. |
| 2012/0097992 A1 | 4/2012 | Jeong |
| 2012/0175605 A1 | 7/2012 | Shin et al. |
| 2012/0176025 A1* | 7/2012 | Lee et al. ....................... 313/503 |
| 2012/0229014 A1* | 9/2012 | Shiratori ........................ 313/498 |
| 2012/0299023 A1 | 11/2012 | Lee et al. |
| 2012/0313098 A1* | 12/2012 | Kim et al. ....................... 257/59 |
| 2013/0001528 A1 | 1/2013 | Chang et al. |

FOREIGN PATENT DOCUMENTS

| | | |
|---|---|---|
| JP | 04-272170 A | 9/1992 |
| JP | 11-144865 A | 5/1999 |
| JP | 2000-068054 | 3/2000 |
| JP | 2000-323277 | 11/2000 |
| JP | 2001-052862 A | 2/2001 |
| JP | 2001-093667 A | 4/2001 |
| JP | 2002-175878 A | 6/2002 |
| JP | 2003-3250 A | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-103341 A | 4/2004 |
| JP | 2004-303269 A | 4/2004 |
| JP | 2004-199919 A | 7/2004 |
| JP | 2004-207217 | 7/2004 |
| JP | 2005-044592 A | 2/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2007-047293 A | 2/2007 |
| JP | 2007-242436 A | 9/2007 |
| JP | 2008-121098 A | 5/2008 |
| JP | 2009-019243 A | 1/2009 |
| JP | 2009-87910 A | 4/2009 |
| JP | 2011-29542 | 2/2011 |
| KR | 10-0257219 B1 | 2/2000 |
| KR | 10-2000-0019254 A | 4/2000 |
| KR | 10-2000-0023929 A | 5/2000 |
| KR | 2001-0030175 A | 4/2001 |
| KR | 10-2001-0039298 A | 5/2001 |
| KR | 10-2001-0059939 A | 7/2001 |
| KR | 10-2002-0000201 A | 1/2002 |
| KR | 10-2002-0050922 A | 6/2002 |
| KR | 10-2002-0090934 A | 12/2002 |
| KR | 10-2002-0091457 A | 12/2002 |
| KR | 10-0405080 B1 | 11/2003 |
| KR | 10-2003-0091947 A | 12/2003 |
| KR | 10-2003-0093959 A | 12/2003 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-0483487 B1 | 4/2005 |
| KR | 10-2005-0082644 | 8/2005 |
| KR | 10-0520159 B1 | 10/2005 |
| KR | 10-2006-0008602 A | 1/2006 |
| KR | 10-2006-0018745 A | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0059323 A | 6/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0635903 B1 | 10/2006 |
| KR | 10-2006-0114477 A | 11/2006 |
| KR | 10-2006-0114573 | 11/2006 |
| KR | 10-2006-0114573 A | 11/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-2007-0037848 | 4/2007 |
| KR | 10-2007-0037848 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-0797787 B1 | 1/2008 |
| KR | 10-0800125 B1 | 1/2008 |
| KR | 10-0815265 B1 | 3/2008 |

(56) References Cited

FOREIGN PATENT DOCUMENTS

| KR | 10-0823508 B1 | 4/2008 |
|---|---|---|
| KR | 10-0823511 | 4/2008 |
| KR | 10-0827760 B1 | 5/2008 |
| KR | 10-08393801 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2008-0088737 A | 10/2008 |
| KR | 10-2009-0017910 A | 2/2009 |
| KR | 10-2009-0038733 A | 4/2009 |
| KR | 10-2009-0097453 A | 9/2009 |
| KR | 10-2009-0106373 | 10/2009 |
| KR | 10-0961110 B1 | 6/2010 |
| KR | 10-2010-0138139 A | 12/2010 |
| KR | 10-2011-0021090 A | 3/2011 |
| KR | 10-2011-0022512 A | 3/2011 |
| KR | 10-2011-0032589 A | 3/2011 |
| KR | 10-2011-0082418 | 7/2011 |
| KR | 10-2011-0120213 A | 11/2011 |
| KR | 10-2011-0138787 A | 12/2011 |
| KR | 10-2012-0042155 A | 5/2012 |
| KR | 10-2012-0080855 A | 7/2012 |
| KR | 10-2012-0131545 A | 12/2012 |
| KR | 10-2013-0007308 | 1/2013 |

OTHER PUBLICATIONS

Patent Abstracts of Japan and English Machine Translation of JP 2007-242436 A, 26 pages.
Patent Abstracts of Japan and English Machine Translation of JP 2001-052862 A, 20 pages.
Patent Abstracts of Japan and English Machine Translation of JP 2003-3250 A, 25 pages.
Korean Reg. Det. Certificate dated Nov. 30, 2011 for Application No. KR 10-2009-0056530, 5 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.
Korean Patent Abstracts, Publication No. 10-2002-0056238 A, dated Jul. 10, 2002, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
Korean Patent Abstracts, Publication No. 2008-0002189 A, dated Jan. 4, 2008, for corresponding Korean Patent No. 10-0800125 B1, 1 page.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.
Korean Patent Abstracts, Publication No. 10-2010-0027524 A, dated Mar. 11, 2010, for corresponding Korean Patent No. KR 10-0961110, 1 page.
U.S. Office action dated May 24, 2013, corresponding to U.S. Appl. No. 13/279,077.
U.S. Office action dated Oct. 7, 2013, corresponding to U.S. Appl. No. 13/279,077.
KIPO Office action dated Sep. 25, 2015, for Korean priority Patent application 10-2012-0077362, including English Translation (13 pages).

* cited by examiner

FLAT PANEL DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0077362, filed on Jul. 16, 2012, in the Korean Intellectual Property Office, the disclosure of which is incorporated herein in its entirety by reference.

BACKGROUND

1. Field

The present invention relates to a flat panel display device and a method of manufacturing the same.

2. Description of the Related Art

In a flat panel display device, for example an organic light-emitting display device, an organic light-emitting layer is formed using a deposition process.

However, color mixture of sub-pixels with different colors may occur due to shadow caused by masking for deposition during the deposition process.

When color mixture of sub-pixels occurs, luminous efficiency may drop, and chromaticity may be degraded.

SUMMARY

The present invention provides a flat panel display device that may reduce color mixture occurring in sub-pixels and a method of manufacturing the flat panel display device.

According to embodiments of the present invention, a flat panel display device includes: a substrate; an insulating layer on the substrate, the insulating layer having first openings, second openings, and third openings; a plurality of first lines on the insulating layer, the first lines being overlapped with the first openings and extending in a first direction, the plurality of first lines including a first organic light-emitting layer; a plurality of second lines on the insulating layer, the second lines being overlapped with the second openings and extending in the first direction, the plurality of second lines including a second organic light-emitting layer that is different from the first organic light-emitting layer; and a plurality of third lines on the insulating layer, the third lines being overlapped with the third openings and extending in the first direction, the plurality of third lines including a third organic light-emitting layer that is different from the first and second organic light-emitting layers. The first lines and the second lines, which are adjacent to each other, are partially overlapped with each other on the insulating layer, and the first lines, the second lines, and the third lines are not overlapped with the openings overlapped with other ones of the lines.

The second lines and the third lines, which are adjacent to each other, may be partially overlapped with each other on the insulating layer.

A distance between the first openings and the second openings adjacent to the first openings, or a distance between the first openings and the third openings adjacent to the first openings, may be different from a distance between the second openings and the third openings adjacent to the second openings.

The distance between the first openings and the second openings adjacent to the first openings, or the distance between the first openings and the third openings adjacent to the first openings, may be greater than the distance between the second openings and the third openings adjacent to the second openings.

At least two openings from among the first openings, the second openings, and the third openings may have different sizes from each other.

A size of each of the third openings may be greater than a size of each of the first openings or a size of each of the second openings.

The insulating layer may have fourth openings, and the flat panel display device may further include a plurality of fourth lines on the insulating layer, the fourth lines being overlapped with the fourth openings and extending in the first direction, the plurality of fourth lines including a fourth organic light-emitting layer that is different from the first, second, and third organic light-emitting layers.

In another embodiment according to the present invention, a flat panel display device includes: a substrate; an insulating layer on the substrate, the insulating layer having first openings, second openings, and third openings; a plurality of first lines on the insulating layer, the first lines being overlapped with the first openings and extending in a first direction, the plurality of first lines including a first organic light-emitting layer; a plurality of second lines on the insulating layer, the second lines being overlapped with the second openings and extending in the first direction, the plurality of second lines including a second organic light-emitting layer that is different from the first organic light-emitting layer; and a plurality of third lines on the insulating layer, the third lines being overlapped with the third openings and extending in the first direction, the plurality of third lines including a third organic light-emitting layer that is different from the first and second organic light-emitting layers. The first lines, the second lines, and the third lines are not overlapped with the openings overlapped with other ones of the lines, and a distance between the first openings and the second openings adjacent to the first openings, or a distance between the first openings and the third openings adjacent to the first openings, is different from a distance between the second openings and the third openings adjacent to the second openings.

The distance between the first openings and the second openings adjacent to the first openings, or the distance between the first openings and the third openings adjacent to the first openings, may be greater than the distance between the second openings and the third openings adjacent to the second openings.

At least two openings from among the first openings, the second openings, and the third openings may have different sizes from each other.

A size of each of the third openings may be greater than a size of each of the first openings or a size of each of the second openings.

The insulating layer may have fourth openings, and the flat panel display device may further include a plurality of fourth lines on the insulating layer, the fourth lines being overlapped with the fourth openings extending in the first direction, the plurality of fourth lines including a fourth organic light-emitting layer that is different from the first, second, and third organic light-emitting layers.

In another embodiment according to the present invention, a flat panel display device includes: a substrate; an insulating layer on the substrate, the insulating layer having first openings, second openings, and third openings; a plurality of first lines on the insulating layer, the first lines being overlapped with first openings and extending in a first direction, the plurality of first lines including a first organic light-emitting layer; a plurality of second lines on the insulating layer, the second lines being overlapped with the second openings and extending in the first direction, the plurality of second lines including a second organic light-emitting layer that is different from the first organic light-emitting layer; and a plurality of third lines on the insulating layer, the third lines being overlapped with the third openings and extending in the first direction, the plurality of third lines including a third organic light-emitting layer that is different from the first and second organic light-emitting layers. The first lines, the second lines, and the third lines are not overlapped with the openings that are overlapped with other ones of the lines, and a distance between the first openings and the second openings adjacent to the first openings, a distance between the first openings and the third openings adjacent to the first openings, and a distance between the second openings and the third openings adjacent to the second openings, are greater than widths of the first, second, and third openings along a second direction, which is perpendicular to the first direction.

At least two openings from among the first openings, the second openings, and the third openings may have different sizes from each other.

A size of each of the third openings may be greater than a size of each of the first openings or a size of each of the second openings.

The insulating layer may have fourth openings, and the flat panel display device may further include a plurality of fourth lines on the insulating layer, the fourth lines being overlapped with the fourth openings and extending in the first direction, the plurality of fourth lines including a fourth organic light-emitting layer that is different from the first, second, and third organic light-emitting layers.

In another exemplary embodiment according to the present invention, a method of manufacturing a flat panel display is provided. The method includes: forming an insulating layer having first openings, second openings, and third openings on a substrate; depositing a first organic light-emitting material discharged from a first deposition assembly on the substrate while the substrate is moved relative to the first deposition assembly spaced apart from the substrate, to form a plurality of first lines including a first organic light-emitting layer, overlapped with the first openings, and extending in a first direction; depositing a second organic light-emitting material discharged from a second deposition assembly on the substrate while the substrate is moved relative to the second deposition assembly spaced apart from the substrate, to form a plurality of second lines including a second organic light-emitting layer, overlapped with the second openings, and extending in the first direction, the second organic light-emitting layer being different from the first organic light-emitting layer; and depositing a third organic light-emitting material discharged from a third deposition assembly on the substrate while the substrate is moved relative to the third deposition assembly spaced apart from the substrate, to form a plurality of third lines including a third organic light-emitting layer, overlapped with the third openings, and extending in the first direction, the third organic light-emitting layer being different from the first and second organic light-emitting layers. The first lines and the second lines, which are adjacent to each other, are partially overlapped with each other on the insulating layer, and the first lines, the second lines, and the third lines are not overlapped with the openings overlapped with other ones of the lines.

The second lines and the third lines, which are adjacent to each other, may be partially overlapped with each other on the insulating layer.

A distance between the first openings and the second openings adjacent to the first openings, or a distance between the first openings and the third openings adjacent to the first openings, may be different from a distance between the second openings and the third openings adjacent to the second openings.

The distance between the first openings and the second openings adjacent to the first openings, or the distance between the first openings and the third openings adjacent to the first openings, may be greater than the distance between the second openings and the third openings adjacent to the second openings.

The deposition of the first organic light-emitting material may be performed before the deposition of the second organic light-emitting material or the deposition of the third organic light-emitting material.

At least two openings from among the first openings, the second openings, and the third openings may have different sizes from each other.

A size of each of the third openings may be greater than a size of each of the first openings or a size of each of the second openings.

The deposition of the first organic light-emitting material, the deposition of the second organic light-emitting material, and the deposition of the third light-emitting material may be performed continuously on the substrate that is moved in the first direction.

The insulating layer may have fourth openings, and the method may further include depositing a fourth organic light-emitting material discharged from a fourth deposition assembly on the substrate while the substrate is moved relative to the fourth deposition assembly spaced apart from the substrate, to form a plurality of fourth lines including a fourth organic light-emitting layer, overlapped with the fourth openings, and extending in the first direction, the fourth organic light-emitting layer being different from the first, second, and third organic light-emitting layers.

The deposition of the first organic light-emitting material, the deposition of the second organic light-emitting material, the deposition of the third light-emitting material, and the deposition of the fourth light-emitting material may be performed continuously on the substrate that is moved in the first direction.

In another embodiment according to the present invention, a method of manufacturing a flat panel display is provided. The method includes: forming an insulating layer having first openings, second openings, and third openings on a substrate; depositing a first organic light-emitting material discharged from a first deposition assembly on the substrate while the substrate is moved relative to the first deposition assembly spaced apart from the substrate, to form a plurality of first lines including a first organic light-emitting layer, overlapped with the first openings, and extending in a first direction; depositing a second organic light-emitting material discharged from a second deposition assembly on the substrate while the substrate is moved relative to the second deposition assembly spaced apart from the substrate, to form a plurality of second lines including a second organic light-emitting layer, overlapped with the second openings, and extending in the first direction, the second organic light-emitting layer being different from the first organic light-emitting layer; and depositing a third organic light-emitting material discharged from a third deposition assembly on the substrate while the substrate is moved relative to the third deposition assembly spaced apart from the substrate, to form a plurality of third lines including a third organic light-emitting layer, overlapped with the third openings, and extending in the first direction, the third organic light-emitting layer being different from the first and second organic light-emitting layers. The first lines, the second lines, and the third lines are not overlapped with the openings overlapped with other ones of the lines, and a distance between the first openings and the second openings adjacent to the first openings, or a distance between the first openings and the third openings adjacent to the first openings, is different from a distance between the second openings and the third openings adjacent to the second openings.

The distance between the first openings and the second openings adjacent to the first openings, or the distance between the first openings and the third openings adjacent to the first openings, may be greater than the distance between the second openings and the third openings adjacent to the second openings.

The deposition of the first organic light-emitting material may be performed before the deposition of the second organic light-emitting material or the deposition of the third organic light-emitting material.

At least two openings from among the first openings, the second openings, and the third openings may have different sizes from each other.

A size of each of the third openings may be greater than a size of each of the first openings or a size of each of the second openings.

The deposition of the first organic light-emitting material, the deposition of the second organic light-emitting material, and the deposition of the third light-emitting material may be performed continuously on the substrate that is moved in the first direction.

The insulating layer may have fourth openings, and the method may further include depositing a fourth organic light-emitting material discharged from a fourth deposition assembly on the substrate while the substrate is moved relative to the fourth deposition assembly spaced apart from the substrate, to form a plurality of fourth lines including a fourth organic light-emitting layer, overlapped with the fourth openings, and extending in the first direction, the fourth organic light-emitting layer being different from the first, second, and third organic light-emitting layers.

The deposition of the first organic light-emitting material, the deposition of the second organic light-emitting material, the deposition of the third light-emitting material, and the deposition of the fourth light-emitting material may be performed continuously on the substrate that is moved in the first direction.

In another embodiment according to the present invention, a method of manufacturing a flat panel display is provided. The method includes: forming an insulating layer having first openings, second openings, and third openings on a substrate; depositing a first organic light-emitting material discharged from a first deposition assembly on the substrate while the substrate is moved relative to the first deposition assembly spaced apart from the substrate, to form a plurality of first lines including a first organic light-emitting layer, overlapped with the first openings, and extending in a first direction; depositing a second organic light-emitting material discharged from a second deposition assembly on the substrate while the substrate is moved relative to the second deposition assembly spaced apart from the substrate, to form a plurality of second lines including a second organic light-emitting layer, overlapped with the second openings, and extending in the first direction, the second organic light-emitting layer being different from the first organic light-emitting layer; and depositing a third organic light-emitting material discharged from a third deposition assembly on the substrate while the substrate is moved relative to the third deposition assembly spaced apart from the substrate, to form a plurality of third lines including a third organic light-emitting layer, overlapped with the third openings, and extending in the first direction, the third organic light-emitting layer being different from the first and second organic light-emitting layers. The first lines, the second lines, and the third lines are not overlapped with the openings overlapped with other ones of the lines, and a distance between the first openings and the second openings adjacent to the first openings, a distance between the first openings and the third openings adjacent to the first openings, and a distance between the second openings and the third openings adjacent to the second openings, are greater than widths of the first, second, and third openings along a second direction, which is perpendicular to the first direction.

At least two openings from among the first openings, the second openings, and the third openings may have different sizes from each other.

A size of each of the third openings may be greater than a size of each of the first openings or a size of each of the second openings.

The deposition of the first organic light-emitting material, the deposition of the second organic light-emitting material, and the deposition of the third light-emitting material may be performed continuously on the substrate that is moved in the first direction.

The insulating layer may have fourth openings, and the method may further include depositing a fourth organic light-emitting material discharged from a fourth deposition assembly on the substrate while the substrate is moved relative to the fourth deposition assembly spaced apart from the substrate, to form a plurality of fourth lines including a fourth organic light-emitting layer, overlapped with the fourth openings, and extending in the first direction, the fourth organic light-emitting layer being different from the first, second, and third organic light-emitting layers.

The deposition of the first organic light-emitting material, the deposition of the second organic light-emitting material, the deposition of the third organic light-emitting material, and the deposition of the fourth organic light-emitting material may be performed continuously on the substrate that is moved in the first direction.

According to embodiments of the present invention, occurrence of color mixture of sub-pixels with different colors may be reduced, and thus degradation of luminous efficiency and/or chromaticity may be prevented.

Also, patterning of an organic light-emitting layer may be achieved through a continuous deposition process, thus a speed of operation may be significantly increased, and good quality of deposition product may be maintained.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
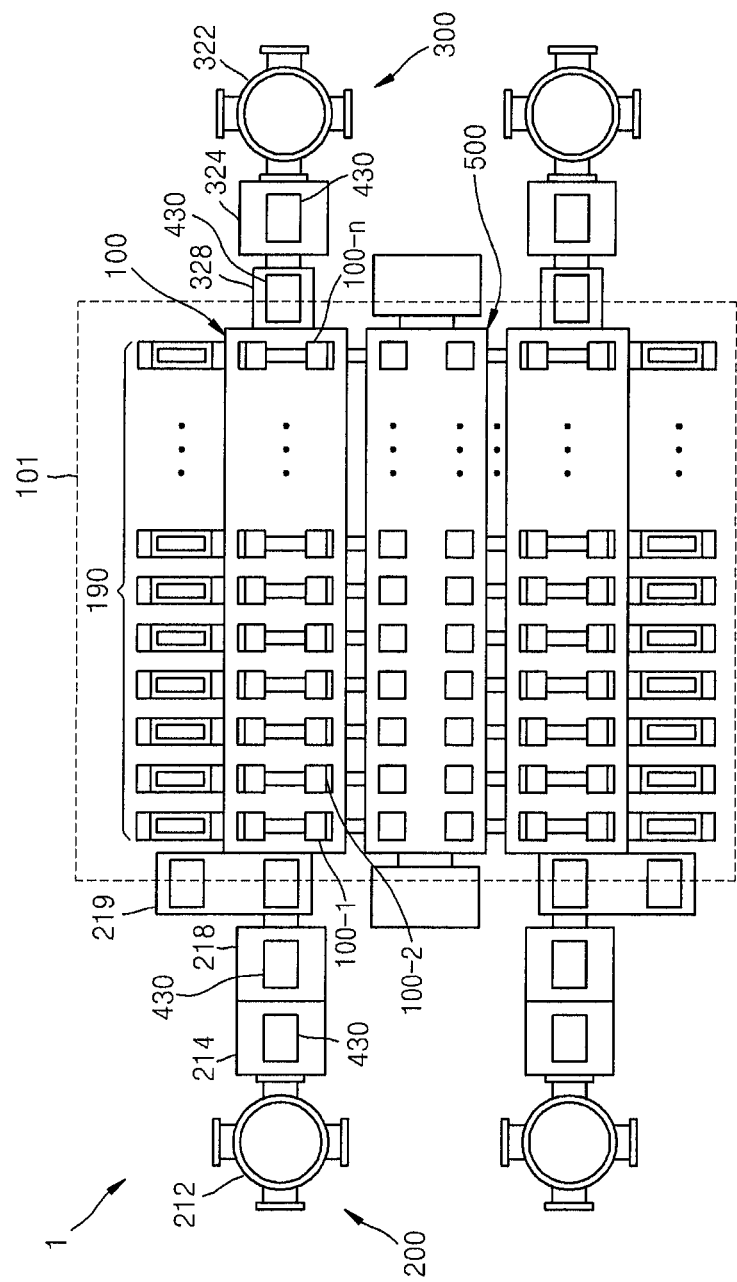
FIG. 1 is a schematic plan view illustrating a structure of an organic layer deposition apparatus for manufacturing a flat panel display device according to an embodiment of the present invention.

Reference will now be made in detail to embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
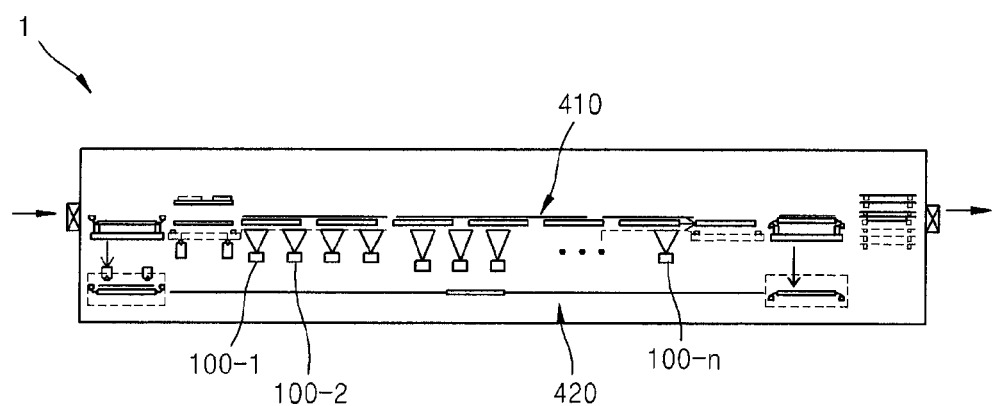
FIG. 2 is a schematic side view of a deposition unit of the organic layer deposition apparatus of FIG. 1.

FIG. 1 is a schematic plan view illustrating a structure of an organic layer deposition apparatus 1 for manufacturing a flat panel display device according to an embodiment of the present invention. FIG. 2 is a schematic side view of a deposition unit 100 of the organic layer deposition apparatus 1 of FIG. 1, according to an embodiment of the present invention.

Figure 3:
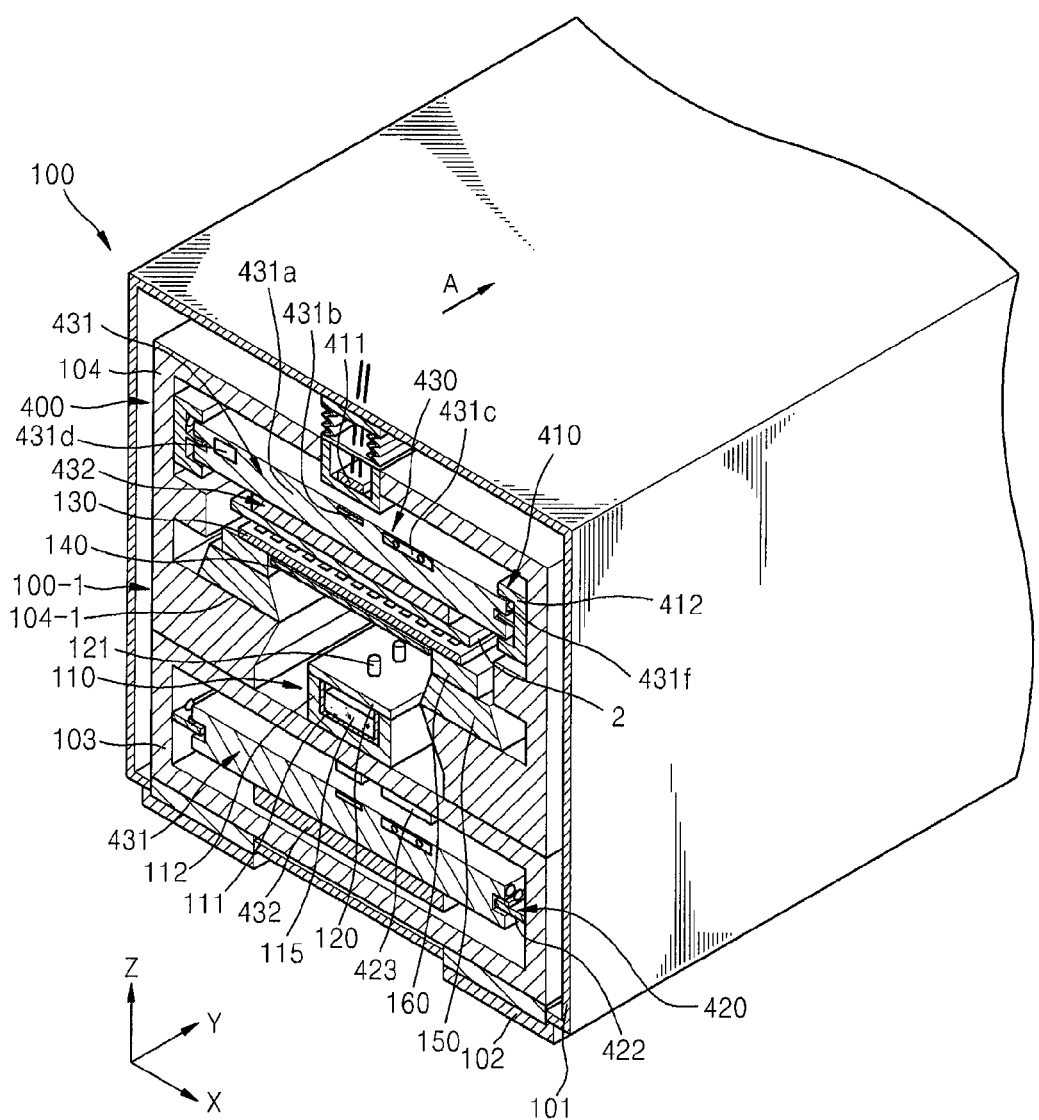
FIG. 3 is a schematic perspective view of the deposition unit of the organic layer deposition apparatus of FIG. 1.
Figure 4:
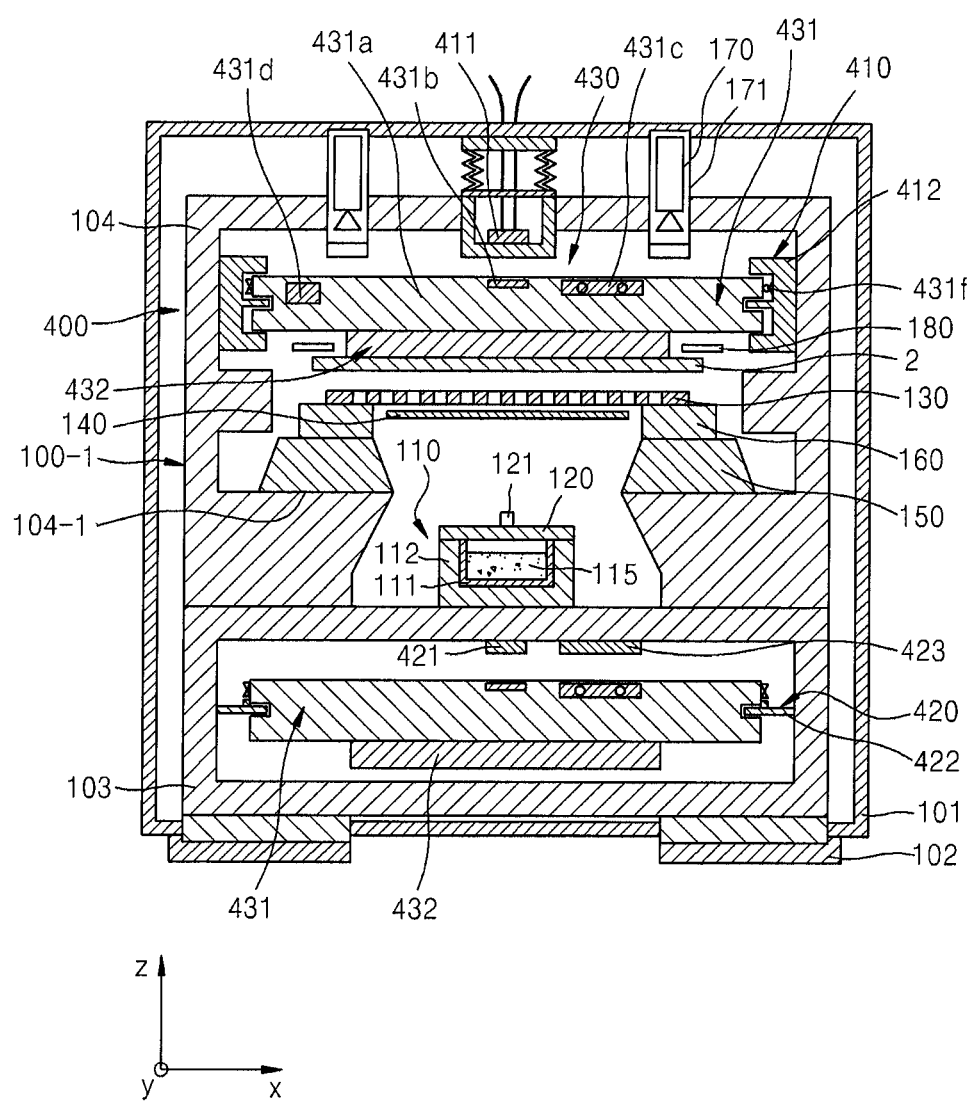
FIG. 4 is a schematic cross-sectional view of the deposition unit of FIG. 3.

Referring to FIGS. 1 and 2, the organic layer deposition apparatus 1 includes the deposition unit 100, a loading unit 200, an unloading unit 300, and a conveyer unit 400 (also refer to FIGS. 3 and 4).

The loading unit 200 may include a first rack 212, a transport chamber 214, a first inversion chamber 218, and a buffer chamber 219.

A plurality of substrates (for example, one substrate 2 is shown in FIGS. 3-9) onto which a deposition material has not yet been applied are stacked up on the first rack 212. A transport robot (not shown) included in the transport chamber 214 picks up one of the substrates from the first rack 212, and places it on a transfer unit 430 transferred by a second conveyer unit 420. Then, the transfer unit 430 on which the substrate is disposed is moved into the first inversion chamber 218.

The first inversion chamber 218 is located adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates on a top surface of the transfer unit 430, and the transfer unit 430 on which the substrate is located is then transferred into the first inversion chamber 218. The first inversion robot of the first inversion chamber 218 inverts the substrate so that the substrate is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate is placed on the transfer unit 430, and then moves the transfer unit 430 on which the substrate is placed into an ejection chamber 324. Then, an ejection robot takes the transfer unit 430 on which the substrate is placed out of the ejection chamber 324, separates the substrate from the transfer unit 430, and then loads the substrate on a second rack 322. The transfer unit 430, separated from the substrate, is returned to the loading unit 200 via the second conveyer unit 420.

However, the present invention is not limited to the above example. For example, when placing the substrate on the transfer unit 430, the substrate may be fixed (or attached) onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1)(100-2) . . . (100-n) may be located. Referring to FIG. 1, 11 organic layer deposition assemblies, i.e., a first organic layer deposition assembly (100-1), a second organic layer deposition assembly (100-2), through an eleventh organic layer deposition assembly (100-11), are located in the chamber 101, but the number of organic layer deposition assemblies may vary with a desired deposition material and deposition conditions. The chamber 101 is maintained in vacuum during the deposition process.

In the embodiment illustrated in FIG. 1, the transfer unit 430 with the substrate fixed (or attached) thereon may be moved at least to the deposition unit 100, or may be moved sequentially to the loading unit 200, the deposition unit 100, and the unloading unit 300, by the first conveyer unit 410, and the transfer unit 430 that is separated from the substrate in the unloading unit 300 may be moved back to the loading unit 200 by the second conveyer unit 420.

The first conveyer unit 410 passes through the chamber 101 when passing through the deposition unit 100, and the second conveyer unit 420 conveys (or transports) the transfer unit 430 from which the substrate is separated.

Here, the organic layer deposition apparatus 1 is configured such that the first conveyer unit 410 and the second conveyer unit 420 are respectively located above and below so that after the transfer unit 430, on which deposition has been completed while passing through the first conveyer unit 410, is separated from the substrate in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 located at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of each of the organic layer deposition assemblies (100-1)(100-2) . . . (100-n) may be easily replaced.

FIG. 1 illustrates the organic layer deposition apparatus 1 in which two sets of structures each including the loading unit 200, the deposition unit 100, the unloading unit 300, and the conveyer unit 400 are arranged in parallel. In such an embodiment, a patterning slit sheet replacement unit 500 may be located between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes the patterning slit sheet replacement unit 500.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is located on the foot 102, and an upper housing 104 is located on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are located on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, a camera (or cameras) 170, and a sensor (or sensors) 180. In this regard, all the elements illustrated in FIGS. 3 and 4 may be arranged in the chamber 101 maintained in an appropriate vacuum state. This structure is used to achieve the linearity of a deposition material.

For example, in order to deposit a deposition material 115 that has been discharged from the deposition source 110 and passed through the deposition source nozzle unit 120 and the patterning slit sheet 130, onto a substrate 2 in a desired pattern, it is desirable to maintain the chamber (not shown) in the same vacuum state as that used in a deposition method using a fine metal mask (FMM). In addition, the temperature of the patterning slit sheet 130 should be sufficiently lower than that of the deposition source 110 because thermal expansion of the patterning slit sheet 130 is reduced or minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate of 40 inches or greater may be used as the substrate 2, such as a mother glass, for manufacturing a plurality of flat panel displays.

According to the present embodiment, the deposition process may be performed with the substrate 2 being moved relative to the organic layer deposition assembly 100-1.

In the organic layer deposition assembly 100-1, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be smaller (e.g., much smaller) than a fine metal mask (FMM) used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed smaller (e.g., much smaller) than the FMM used in a conventional deposition method, it is relatively easy to manufacture the patterning slit sheet 130. That is, the small patterning slit sheet 130 is more suitable in view of the manufacturing processes, including etching followed by precise elongation, welding, transferring, and washing processes, than the FMM used in a conventional deposition method. In addition, this is more suitable for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance (e.g., a gap). This is described below in more detail.

The deposition source 110 that contains and heats the deposition material 115 is located at a side opposite to (facing) a side in which the substrate 2 is located in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120, in one embodiment, is located at a side of the deposition source 110 facing the substrate 2. In this regard, the organic layer deposition assemblies each may include different deposition source nozzles 121 in performing deposition for forming common layers and pattern layers. That is, a plurality of deposition source nozzles 121 may be formed in (e.g., arranged along) the Y-axis, or arranged along the scanning direction of the substrate 2, in the deposition source nozzle unit 120 for forming a pattern layer. Accordingly, the deposition source nozzles 121 are formed such that only one line of the deposition source nozzles 121 is formed along the X-axis direction, to reduce (or significantly reduce) occurrence of shadows. Further, a plurality of deposition source nozzles 121 may be formed along the X-axis in the deposition source nozzle unit 120 for forming a common layer. By doing so, a thickness uniformity of the common layer may be improved.

In one embodiment, the patterning slit sheet 130 may be located between the deposition source 110 and the substrate 2. The patterning slit sheet 130 may further include a frame having a shape similar to a window frame. The patterning slit sheet 130 includes a plurality of patterning slits 131 arranged along the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance (e.g., a gap).

As described above, deposition is performed while the organic layer deposition assembly 100-1 is moved relative to the substrate 2. In order for the organic layer deposition assembly 100-1 to be moved relative to the substrate 2, the patterning slit sheet 130 is spaced apart from the substrate 2 by a certain distance (e.g., a gap).

In a conventional deposition method using an FMM, deposition is typically performed with the FMM in close contact with a substrate in order to prevent formation of shadows on the substrate. However, when the FMM is formed in close contact with the substrate, defects due to the contact between the substrate and the FMM may occur. In addition, because it is difficult to move the mask with respect to the substrate, the mask and the substrate have the same size. Accordingly, the mask becomes larger as the size of a display device increases. However, it is difficult to form a large mask.

To address these problems, in the organic layer deposition assembly 100-1 according to the present embodiment, the patterning slit sheet 130 is formed spaced apart by a certain distance (e.g., a gap) from the substrate 2 on which a deposition material is to be deposited.

According to the present embodiment, deposition may be performed while a mask formed smaller than a substrate is moved with respect to the substrate, and thus, it is relatively easy to manufacture the mask. In addition, defects due to contact between the substrate and the mask may be prevented. In addition, because it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are located at a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed (or located) on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is located on the second stage 160. The patterning slit sheet 130 is located on the first stage 150 and the second stage 160 so as to move in the X-axis, Y-axis, and Z-axis directions, and thus, an alignment, in particular, a real-time alignment, between the substrate 2 and the patterning slit sheet 130, may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be located between the patterning slit sheet 130 and the deposition source 110. In particular, an anode or cathode pattern is formed on an edge portion of the substrate 2 and is used as a terminal for inspecting a product or in manufacturing a product. If an organic material is applied on this region (i.e., the region on which the anode or cathode pattern is formed) of the substrate 2, the anode or the cathode cannot sufficiently perform its function. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2. Therefore, to prevent the organic material from being deposited on the non-film-forming region of the substrate 2, in the organic layer deposition apparatus, the shielding member 140 may be located at the edge portion of the substrate 2. Although not particularly illustrated in FIGS. 3 and 4, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

Referring to FIGS. 3 and 4, the conveyer unit 400 includes the first conveyer unit 410, the second conveyer unit 420, and the transfer unit 430.

The first conveyer unit 410 conveys (or transports) in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended (e.g., magnetically levitating) bearings (not shown), side magnetically suspended (e.g., magnetically levitating) bearings (not shown), and gap sensors (not shown). In one embodiment, the magnetically suspended bearings and the gap sensors are mounted on the guide members 412.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed (or transported) along the first conveyer unit 410 and the second conveyer unit 420 and the electrostatic chuck 432 that is combined on (or attached to) a surface of the carrier 431. The substrate 2 is attached to the electrostatic chuck 432.

Hereinafter, each element of the conveyer unit 400 will be described in more detail.

The carrier 431 of the transfer unit 430 will now be described in detail.

The carrier 431 includes a main body part 431a, a magnetic rail (e.g., a linear motor system (LMS) magnet) 431b, contactless power supply (CPS) modules 431c, a power supply unit 431d, and guide grooves.

The main body part 431a constitutes a base part of the carrier 431 and may be formed of a magnetic material such as iron. In this regard, due to a repulsive force between the main body part 431a and the respective upper and side magnetically suspended bearings (e.g., magnetically levitating bearings), the carrier 431 may be maintained spaced apart from the guide members 412 by a certain distance (e.g., a gap).

The guide grooves may be respectively formed at both sides of the main body part 431a and each may accommodate a guide protrusion of the guide member 412.

The magnetic rail 431b may be formed along a center line of the main body part 431a in a direction where the main body part 431a proceeds. The magnetic rail 431b and the coil 411, which are described below in more detail, may be combined with each other to constitute a linear motor, and the carrier 431 may be conveyed (or transported) in an arrow A direction by the linear motor.

The CPS modules 431c and the power supply unit 431d may be respectively formed on both sides of the magnetic rail 431b in the main body part 431a. The power supply unit 431d includes a battery (e.g., a rechargeable battery) that provides power so that the electrostatic chuck 432 can chuck (e.g., fix or hold) the substrate 2 and maintains operation. The CPS modules 431c are wireless charging modules that charge the power supply unit 431d. For example, the charging track 423 formed in the second conveyer unit 420 is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage (e.g., a suitable voltage or a relatively high voltage) is applied to the electrode.

Hereinafter, an operation of the transfer unit 430 is described in detail.

The magnetic rail 431b of the main body part 431a and the coil 411 may be combined with each other to constitute an operation unit. In this regard, the operation unit may be a linear motor. The linear motor has a small frictional coefficient, little position error, and a high degree (e.g., very high degree) of position determination, as compared to a conventional slide guide system. As described above, the linear motor may include the coil 411 and the magnetic rail 431b. The magnetic rail 431b is linearly located on the carrier 431, and a plurality of coils 411 may be located at an inner side of the chamber 101 by a certain distance so as to face the magnetic rail 431b. Because the magnetic rail 431b is located at the carrier 431 instead of the coil 411, the carrier 431 may be operable without power being supplied thereto. The coil 411 may be formed (or located) in an atmosphere (ATM) box, and the magnetic rail 431b is attached to the carrier 431, thus enabling the carrier 431 to operate in the vacuum chamber 101.

Hereinafter, the first conveyer unit 410 and the transfer unit 430 are described in detail.

Referring to FIG. 4, the first conveyer unit 410 conveys (or transports) the electrostatic chuck 432 that fixes (or attaches to) the substrate 2 and the carrier 431 that conveys (or transports) the electrostatic chuck 432. In this regard, the first conveyer unit 410 includes the coil 411, the guide members 412, the upper magnetically suspended (e.g., magnetically levitating) bearings, the side magnetically suspended (e.g., magnetically levitating) bearings, and the gap sensors.

The coil 411 and the guide members 412 are formed (or located) inside the upper housing 104. The coil 411 is formed (or located) in an upper portion of the upper housing 104, and the guide members 421 are respectively formed on both inner sides of the upper housing 104.

The guide members 412 guide the carrier 431 to move in a direction. In this regard, the guide members 412 are formed to pass through the deposition unit 100.

The side magnetically suspended (e.g., magnetically levitating) bearings are each located at the guide member 412 so as to respectively correspond to both sides of the carrier 431. The side magnetically suspended (e.g., magnetically levitating) bearings cause a distance between the carrier 431 and the guide member 412 so that the carrier 431 is moved along the guide members 412 in non-contact with the guide members 412. That is, a repulsive force occurring between the side magnetically suspended (e.g., magnetically levitating) bearing on the left side in FIG. 4 and the carrier 431, which is a magnetic material, and a repulsive force occurring between the side magnetically suspended (e.g., magnetically levitating) bearing on the right side in FIG. 4 and the carrier 431, which is a magnetic material, maintain equilibrium, and thus, there is a constant (or substantially constant) distance between the carrier 431 and the respective parts of the guide member 412.

Each upper magnetically suspended (e.g., magnetically levitating) bearing may be located at the guide member 412 so as to be above the carrier 431. The upper magnetically suspended (e.g., magnetically levitating) bearings enable the carrier 431 to be moved along the guide members 412 in non-contact with the guide members 412 and with a distance therebetween maintained constant (or substantially constant). That is, a repulsive force (or alternatively an attractive force) occurring between the upper magnetically suspended (e.g., magnetically levitating) bearing and the carrier 431, which is a magnetic material, and gravity maintain equilibrium, and thus, there is a constant (or substantially constant) distance between the carrier 431 and the respective guide members 412.

Each guide member 412 may further include the gap sensor. The gap sensor may measure a distance between the carrier 431 and the guide member 412. Also, the gap sensor may be located at a side of the side magnetically suspended (e.g., magnetically levitating) bearing. The gap sensor located at a side of the side magnetically suspended (e.g., magnetically levitating) bearing may measure a distance between a side surface of the carrier 431 and the side magnetically suspended (e.g., magnetically levitating) bearing.

Magnetic forces of the upper and side magnetically suspended (e.g., magnetically levitating) bearings may vary according to values measured by the gap sensors, and thus, distances between the carrier 431 and the respective guide members 412 may be adjusted in real time. That is, a precise transfer of the carrier 431 may be feedback controlled using the upper and side magnetically suspended (e.g., magnetically levitating) bearings and the gap sensors.

Hereinafter, the second conveyer unit 420 and the transfer unit 430 are described in detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be located at a top inner surface of the lower housing 103, and the roller guides 422 may be disposed on both inner sides of the lower housing 103. The coil 421 may be located in an ATM box, similar to the coil 411 of the first conveyer unit 410.

The magnetic rail 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100.

The second conveyer unit 420 is used in a process of returning the carrier 431 from which the substrate 2 has been separated and not in a process of depositing an organic material on the substrate 2, and thus, position accuracy (or positional accuracy) thereof is not needed as by the first conveyer unit 410. Therefore, magnetic suspension (e.g., magnetic levitation) is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. Although not illustrated in FIG. 4, the magnetic suspension (or magnetic levitation) may also be applied to the second conveyer unit 420 as in the first conveyer unit 410.

The organic layer deposition assembly 100-1 of the organic layer deposition apparatus 1 may further include the cameras 170 and the sensors 180 for an aligning process. The cameras 170 may align in real time with a first alignment mark (not shown) formed in the frame 135 of the patterning slit sheet 130 and a second alignment mark (not shown) formed on the substrate 2. In this regard, the cameras 170 are positioned for a more accurate view in the chamber 101 maintained in vacuum during deposition. For this, the cameras 170 may be installed in respective camera accommodation units 171 in an atmospheric state.

Because the substrate 2 and the patterning slit sheet 130 are spaced apart from each other by a certain distance (e.g., a gap), distances to the substrate 2 and the patterning slit sheet 130 that are located at different positions are both measured using the cameras 170. For this operation, the organic layer deposition assembly 100-1 of the organic layer deposition apparatus 1 may include the sensors 180. In this regard, the sensors 180 may be confocal sensors. The confocal sensors may scan an object to be measured by using laser beams that rotate at high speed by using a scanning mirror and measure a distance to the object by using fluorescent or reflected rays emitted by the laser beams. The confocal sensors may measure a distance by sensing a boundary interface between different media.

Because a distance between the substrate 2 and the patterning slit sheet 130 is measurable in real time using the cameras 170 and the sensors 180, the substrate 2 may be aligned with the patterning slit sheet 130 in real time, whereby position accuracy (or positional accuracy) of a pattern may be improved (e.g., significantly improved).

Figure 5:
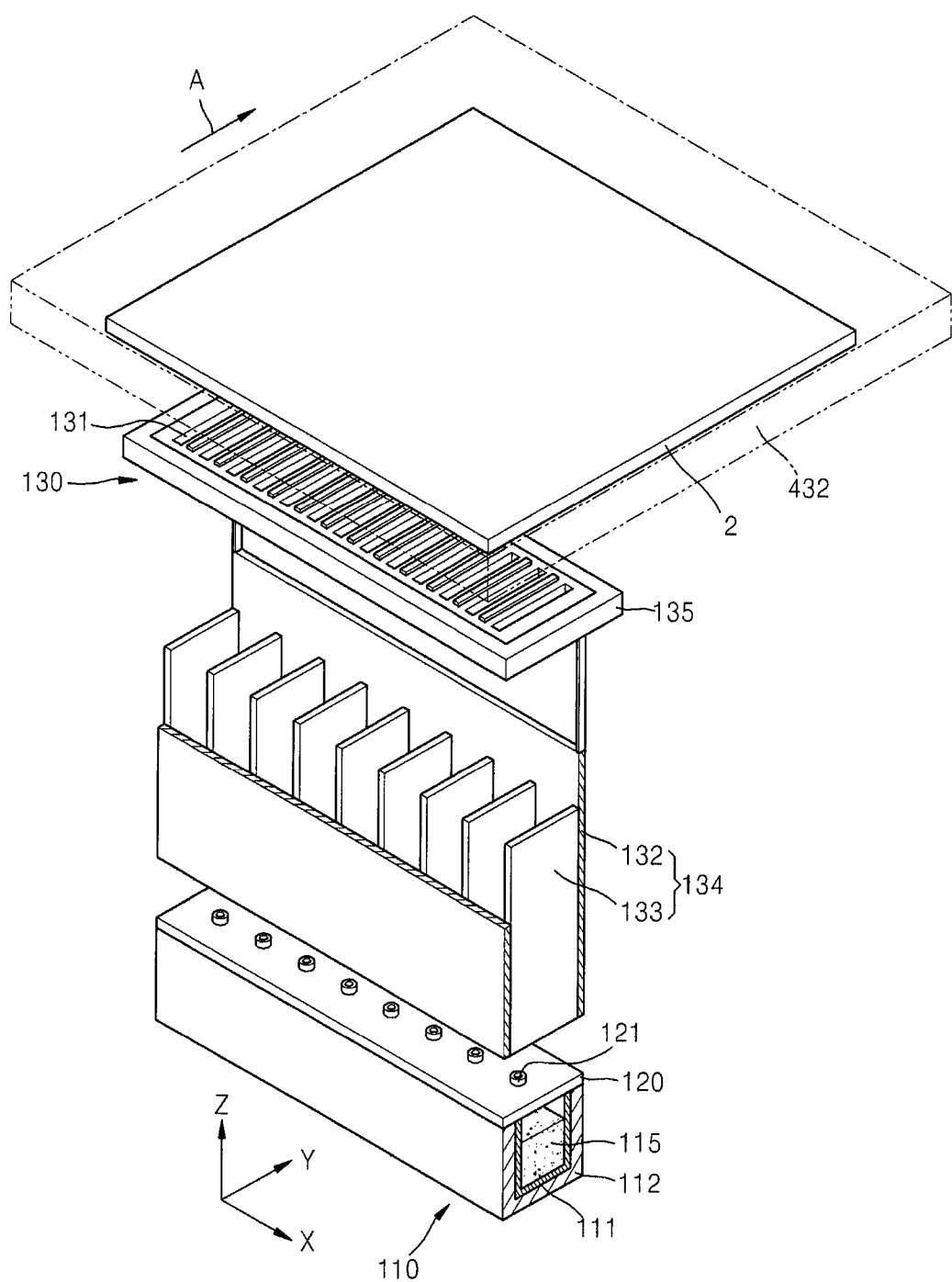
FIG. 5 is a schematic perspective view of an organic layer deposition assembly according to another embodiment of the present invention.
Figure 6:
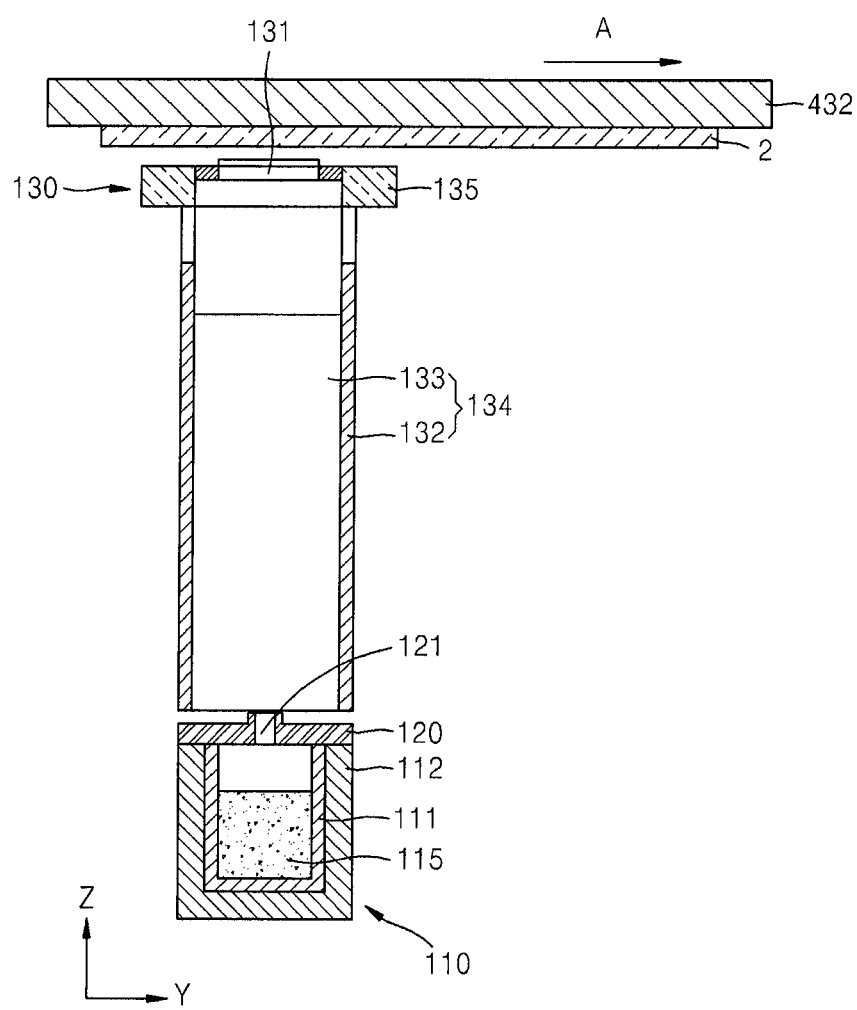
FIG. 6 is a schematic side view of the organic layer deposition assembly of FIG. 5.
Figure 7:
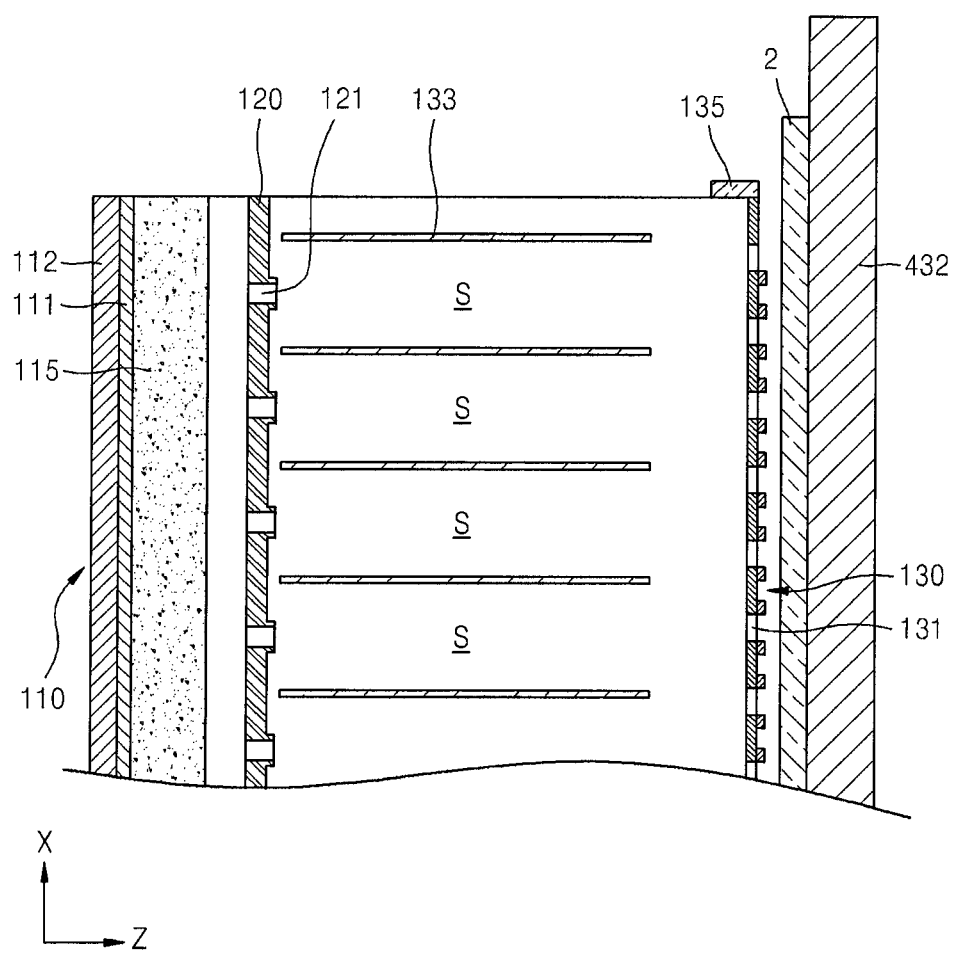
FIG. 7 is a schematic plan view of the organic layer deposition assembly of FIG. 5.

FIG. 5 is a schematic perspective view of an organic layer deposition assembly according to another embodiment of the present invention. FIG. 6 is a schematic side view of the organic layer deposition assembly of FIG. 5. FIG. 7 is a schematic plan view of the organic layer deposition assembly of FIG. 5.

Referring to FIGS. 5 through 7, the organic layer deposition assembly according to the current embodiment of the present invention includes the deposition source 110, the deposition source nozzle unit 120, a shielding plate assembly (e.g., barrier plate assembly) 134, and the patterning slit sheet 130.

The deposition source 110 includes a crucible 111 that is filled with the deposition material 115 and a heater 112 that heats the crucible 111 so as to vaporize the deposition material 115 toward the deposition source nozzle unit 120. The deposition source nozzle unit 120, in one embodiment, is located at a side of the deposition source 110, and the deposition source nozzle unit 120 includes a plurality of deposition source nozzles 121 arranged along an X-axis direction.

The shielding plate assembly 134 is located at a side of the deposition source nozzle unit 120. The shielding plate assembly includes a plurality of shielding plates (e.g., barrier plates) 133 and a shielding plate frame (e.g., barrier plate frame) 132 located outside of (e.g., around or surrounding) the shielding plates 133. The plurality of shielding plates 133 may be arranged in parallel along an X-axis direction. Here, the plurality of shielding plates 133 may be arranged at equal intervals. Also, as shown in FIG. 5, each of the shielding plates 133 may be extended along a YZ plane and, in one embodiment, may have a shape of rectangle. The plurality of shielding plates 133 arranged in such manner comparts (e.g., defines, partitions, separates, or divides) a space between the deposition source nozzle unit 120 and the patterning slit sheet 130 into a plurality of deposition spaces S. That is, the organic layer deposition assembly may have the deposition spaces S that are partitioned according to each of the deposition nozzles 121, from which a deposition material is discharged, as shown in FIG. 7. In this regard, as the shielding plates 133 partition the space between the deposition source nozzle unit 120 and the patterning slit sheet 130 into the plurality of deposition spaces S, a deposition material discharged from one of the deposition source nozzle 121 is not mixed with other deposition materials discharged from other deposition source nozzles 121. Rather, the deposition material from one of the deposition source nozzle 121 is deposited on the substrate 2 through the patterning slit 131. That is, the shielding plates 133 serve to guide a pathway of the deposition material discharged from each of the deposition source nozzles 121 to be linear in a Z-axis direction without being dispersed.

In this regard, the linearity of a deposition material is achieved by including the shielding plates 133, and a size of shadow formed on the substrate 2 may be reduced (e.g., significantly reduced), thus the organic layer deposition assembly and the substrate 2 may be spaced apart by a certain distance.

The patterning slit sheet 130 is further located between the deposition source 110 and the substrate 2. The patterning slit sheet 130 is as described above, thus the detail description is omitted.

Figure 8:
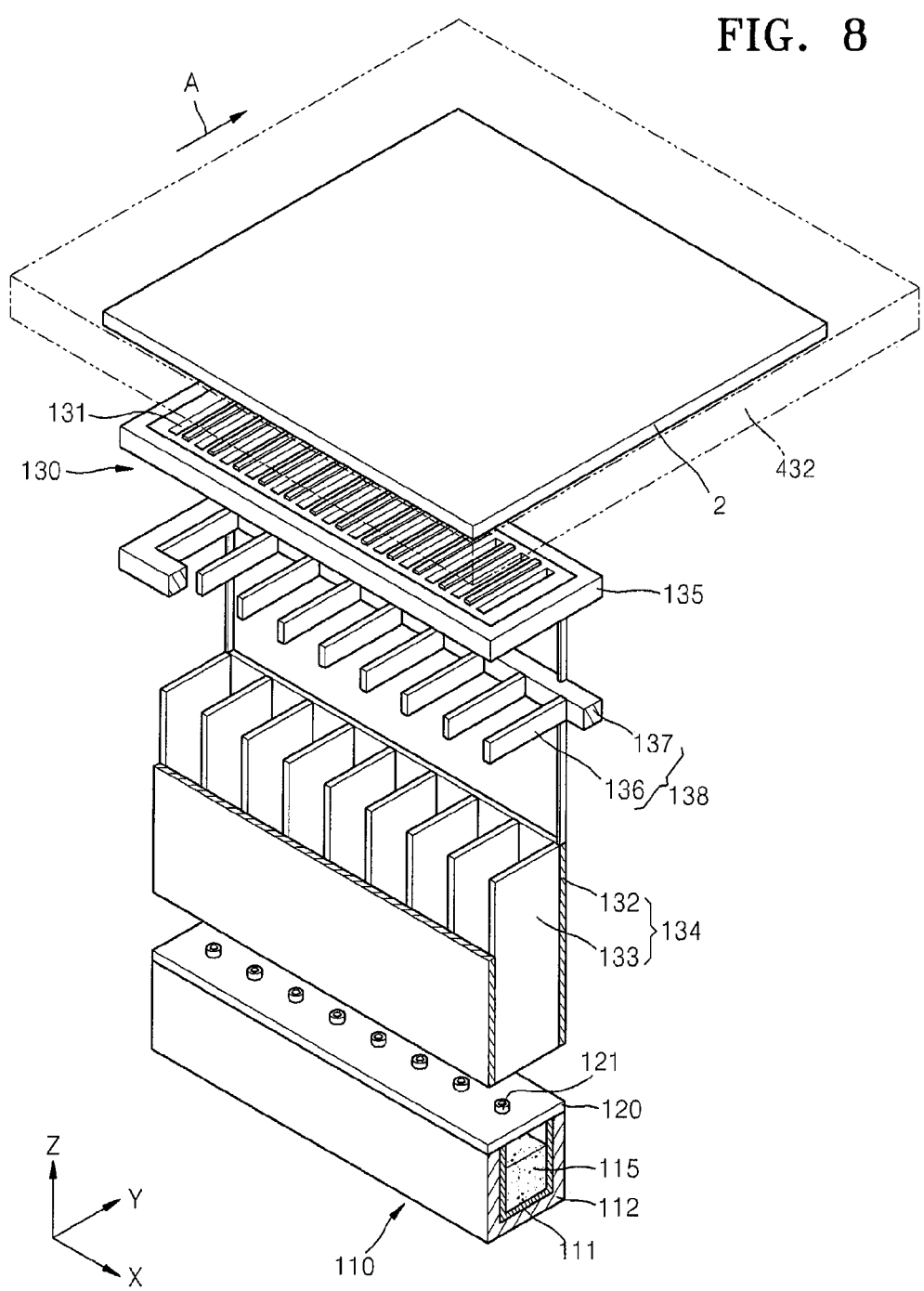
FIG. 8 is a schematic perspective view of an organic layer deposition assembly according to another embodiment of the present invention.

FIG. 8 is a schematic perspective view of an organic layer deposition assembly according to another embodiment of the present invention.

The organic layer deposition assembly of the current embodiment illustrated in FIG. 8 includes the deposition source 110, the deposition source nozzle unit 120, a first shielding plate assembly (e.g., a first barrier plate assembly) 134, a second shielding plate assembly (e.g., a second barrier plate assembly) 138, and the patterning slit sheet 130. Here, detailed structures of the deposition source 110, the deposition source nozzle unit 120, the first shielding plate assembly 134, and the patterning slit sheet 130 are substantially the same as the structures described in the embodiment of FIG. 5, thus the detailed description of the structures is omitted. The current embodiment is different from the embodiment described above in that the second shielding plate assembly 138 is located at a side of the first shielding plate assembly 134.

For example, the second shielding assembly 138 includes a plurality of second shielding plates 136 and a second shielding plate frame 137 located outside (e.g., around or surrounding) the second shielding plates 136. The plurality of first shielding plates 133 may be arranged in parallel along an X-axis direction. Also, the plurality of first shielding plates 133 may be arranged at equal intervals. Moreover, as shown in the drawing, each of the second shielding plates 136 may be formed in parallel with the YZ plane, or in other words, perpendicular to the X-axis.

In this regard, the first shielding plates 133 and the second shielding plates 136 serve to partition the space between the deposition source nozzle unit 120 and the patterning slit sheet 130. That is, the deposition space is separated by the first shielding plates 133 and the second shielding plates 136 according to each of the deposition source nozzles 121, from which a deposition material is discharged.

Here, each of the second shielding plates 136 may be positioned so as to correspond to each of the first shielding plates 133. In other words, each of the second shielding plates 136 may be aligned with a corresponding one of the first shielding plates 133 to be arranged in parallel to each other. That is, the first shielding plates 133 and the second shielding plates 136 are located on the same plane. Although a thickness (or width) of the first shielding plates 133 and a width of the second shielding plates 136 in the X-axis direction are shown as the same in FIG. 8, the present invention is not limited thereto. That is, the second shielding plates 136, which require a fine alignment with the patterning slit 131, may be formed relatively thin, while the first shielding plates 133, which do not require a fine alignment with the patterning slit 131, may be formed relatively thick, thus manufacture of the organic layer deposition assembly may be simplified.

Figure 9:
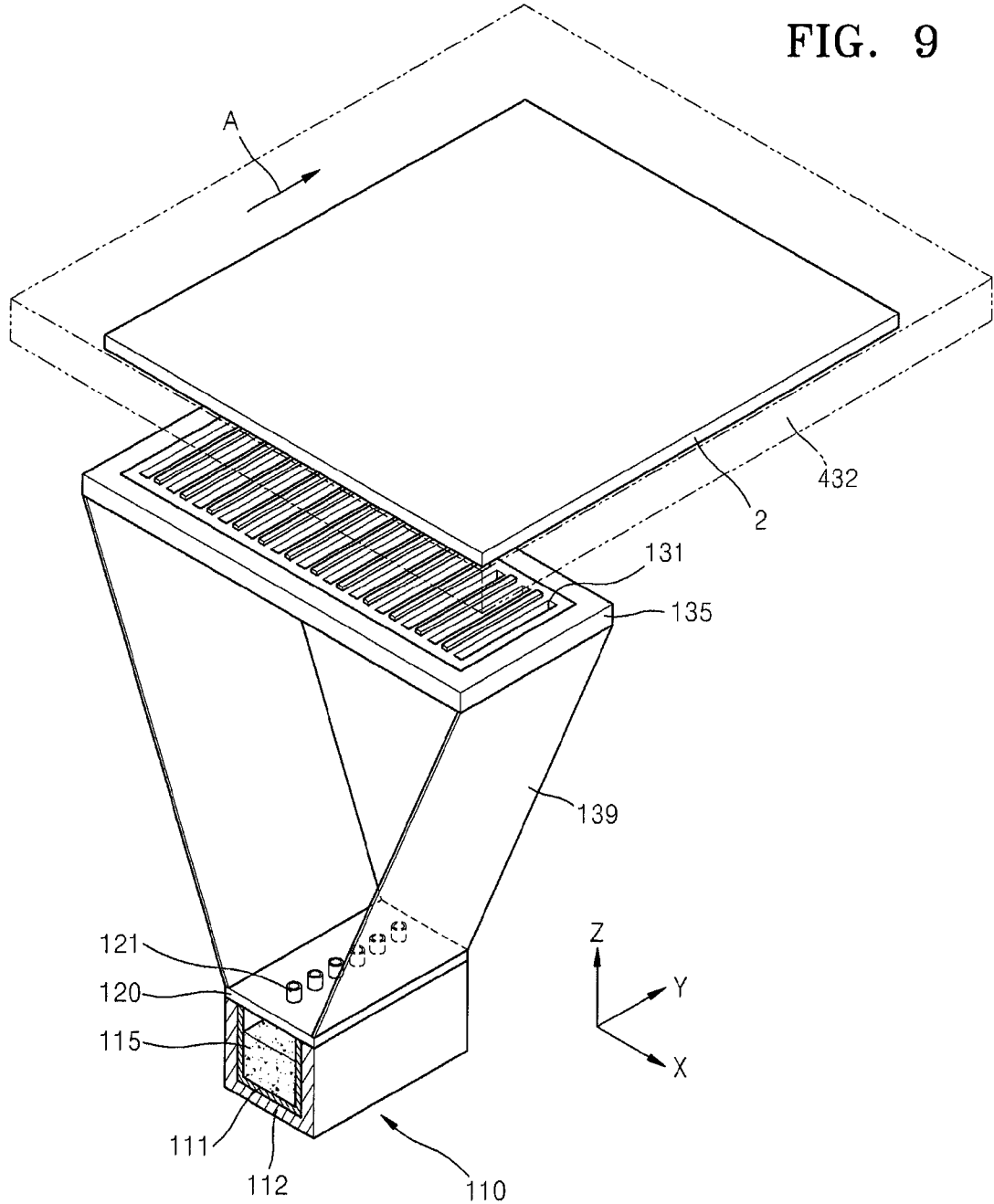
FIG. 9 is a schematic perspective view of an organic layer deposition assembly according to another embodiment of the present invention.

FIG. 9 is a schematic perspective view of an organic layer deposition assembly according to another embodiment of the present invention.

Referring to FIG. 9, the organic layer deposition assembly includes the deposition source 110, the deposition source nozzle unit 120, and the patterning slit sheet 130. Here, detailed structures of the deposition source 110, the deposition source nozzle unit 120, and the patterning slit sheet 130 are substantially the same as the structures described in the embodiment of FIG. 5, thus the detailed description of the structures are omitted. In the current embodiment, the deposition source 110 and the deposition source nozzle unit 120 are bound to (or combined with) the patterning slit sheet 130 by a connection member 139.

Figure 10:
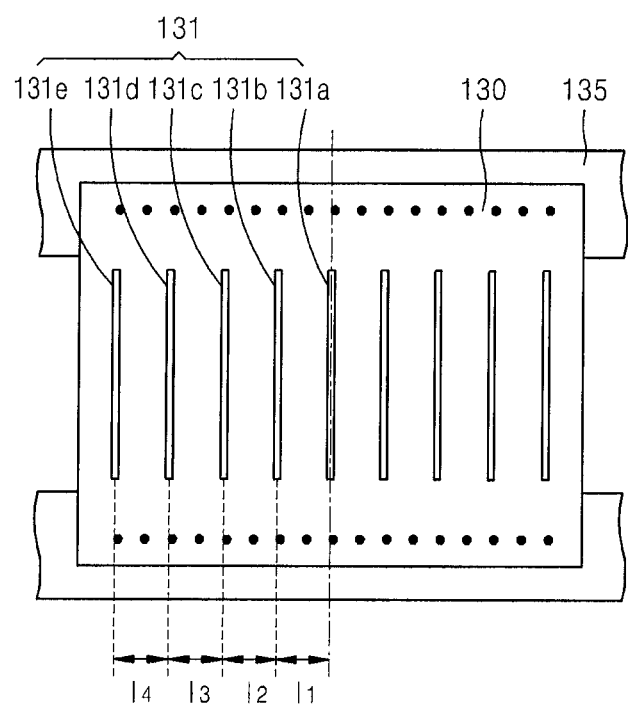
FIG. 10 is a diagram illustrating a structure in which patterning slits are arranged at equal intervals in a patterning slit sheet.
Figure 11:
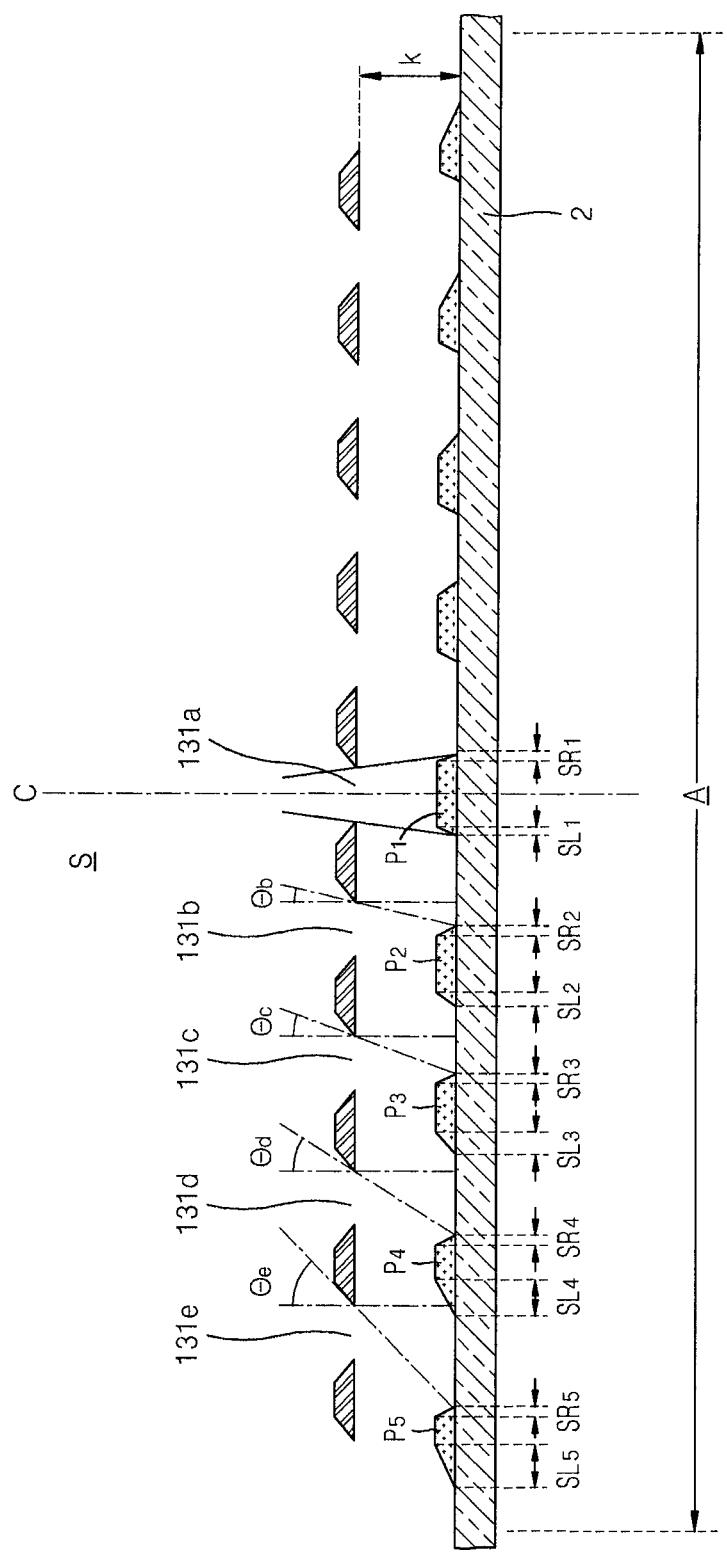
FIG. 11 is a schematic diagram illustrating organic layers formed on a substrate by using the patterning slit sheet.

FIG. 10 is a diagram illustrating a structure in which the patterning slits 131 are arranged at equal intervals in the patterning slit sheet 130 of the organic layer deposition apparatus 1 as described above, according to an embodiment of the present invention. FIG. 11 is a schematic diagram illustrating organic layers formed on the substrate 2 by using the patterning slit sheet 130 of FIG. 10, according to an embodiment of the present invention.

FIGS. 10 and 11 schematically illustrate the patterning slit sheet 130 in which the patterning slits 131 are arranged at equal intervals. That is, in FIG. 10, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum (or reduced) size of a shadow, and a right-side shadow $SR_1$ and a left-side shadow $SL_1$ are formed symmetrical to each other.

However, a critical incident angle θ of the deposition material that passes through patterning slits located farther from the center line C of the deposition space S gradually increases, and thus, in one embodiment, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. For example, a left-side shadow $SL_5$ is larger than a right-side shadow $SR_5$.

That is, as the critical incident angle θ of the deposition material increases, the size of the shadow also increases. For example, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits located farther from the center line C of the deposition space S have a relatively larger shadow size. For example, of the shadows on both sides of the respective organic layers, the size of the shadow at a position farther from the center line C of the deposition space S is larger than that of the other.

That is, referring to FIG. 11, the organic layers formed on the left side of the center line C of the deposition space S have a structure in which a left hypotenuse (a slanted side on the left between top and bottom sides) is larger than a right hypotenuse (a slanted side on the right between the top and bottom sides), and the organic layers formed on the right side of the center line C of the deposition space S have a structure in which a right hypotenuse (e.g., a right slanted side) is larger than a left hypotenuse (e.g., a left slanted side).

Also, in the organic layers formed on the left side of the center line C of the deposition space S, the length of the left hypotenuse (e.g., the left slanted side) increases towards the left. In the organic layers formed on the right side of the center line C of the deposition space S, the length of the right hypotenuse (e.g., the right slanted side) increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $θ_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $θ_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $θ_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $θ_e$, and an organic layer $P_5$ formed using the deposition material that has passed through the patterning slit 131e has a left-side shadow having a size of $SL_5$.

In this regard, the critical incident angles satisfy the following condition: $θ_b<θ_c<θ_d<θ_e$, and thus, the sizes of the shadows of the organic layers also satisfy the following condition: $SL_1<SL_2<SL_3<SL_4<SL_5$.

Figure 12:
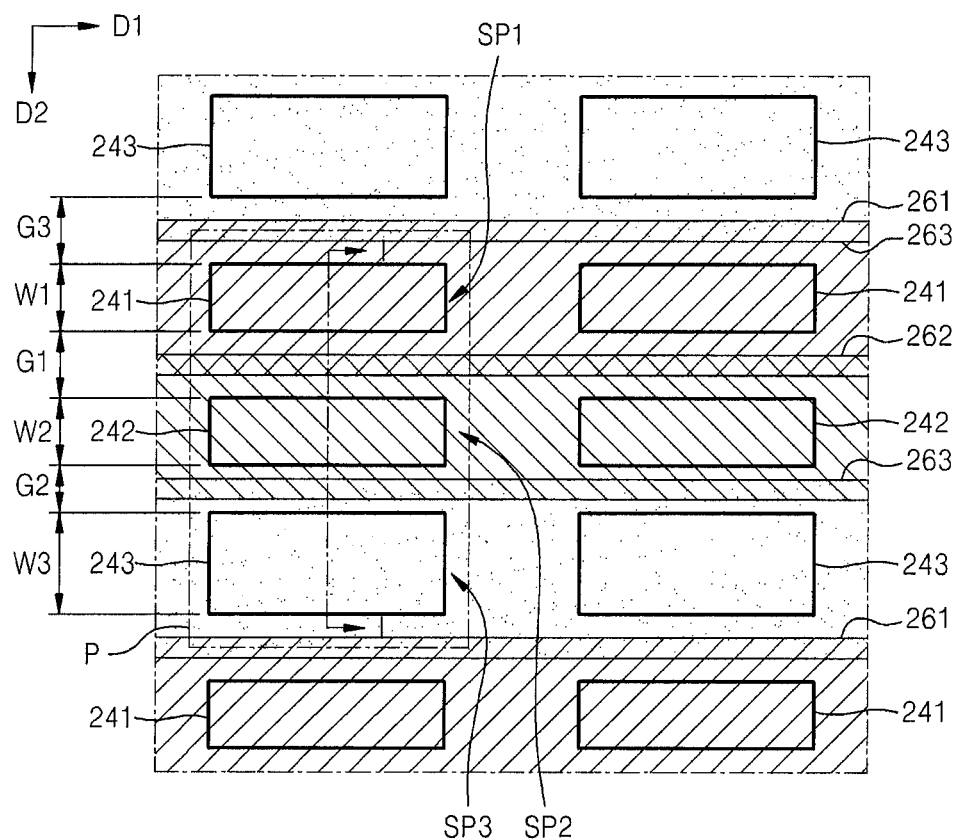
FIG. 12 is a partial plan view of a flat panel display device manufactured using the organic layer deposition apparatus.
Figure 13:
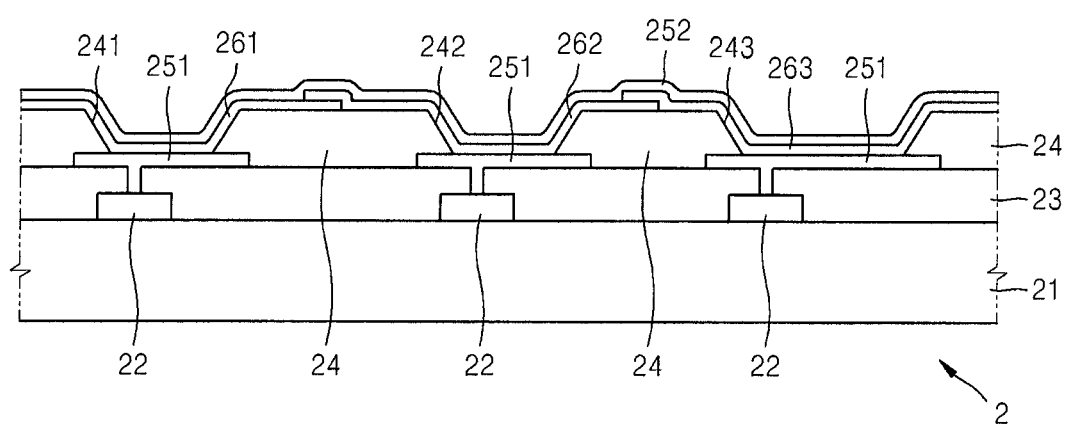
FIG. 13 is a cross-sectional view along the line I-I of FIG. 12.

FIG. 12 illustrates a plane (e.g., a partial plan view) of a flat panel display device manufactured using the organic layer deposition apparatus, which is described above, according to an embodiment of the present invention. FIG. 13 is a cross-sectional view along the line I-I of FIG. 12. For convenience of description, only first openings 241, second openings 242, third openings 243, and first lines 261 to third lines 263 of the cross-sectional view illustrated in FIG. 13 are shown in FIG. 12.

Referring to FIGS. 12 and 13, the flat panel display device is formed on a base substrate 21. The base substrate 21 may be formed of a transparent material, for example, glass, plastic, or metal.

A plurality of pixels P are formed on the base substrate 21, and each of the pixels may include a plurality of sub-pixels that emit different colors from one another. According to FIGS. 12 and 13, each of the pixels P includes a first sub-pixel SP1, a second sub-pixel SP2, and a third sub-pixel SP3. The first sub-pixel SP1, the second sub-pixel SP2, and the third sub-pixel SP3 may each respectively emit red, green and blue light, but the described embodiment of the present invention is not limited thereto. The first sub-pixel SP1, the second sub-pixel SP2, and the third sub-pixel SP3 may have various color combinations that may realize white.

As shown in FIG. 13, each of the sub-pixels includes a driving circuit unit 22. Each of the driving circuit units (or driving circuits) 22 may include at least one thin film transistor and at least one capacitor.

A first insulating layer 23 covers the driving circuit units 22. Also, a plurality of pixel electrodes 251 that are electrically connected with respective ones of the driving circuit units 22 are formed on the first insulating layer 23. Each of the pixel electrodes 251 is located independently (e.g., spaced apart or separately) according to (or corresponding to) a respective one of the sub-pixels.

A second insulating layer 24 is formed on the first insulating layer 23. The second insulating layer 24 is formed as to cover the pixel electrodes 251, and then the first openings 241 through the third openings 243 are formed to expose parts of the respective pixel electrodes 251.

The first openings 241, the second openings 242, and the third openings may be located so as to correspond to the first sub-pixel SP1, the second sub-pixel SP2, and the third sub-pixel SP3, respectively.

The first lines (e.g., a first layer) 261, the second lines (e.g., a second layer) 262, and the third lines (e.g., a third layer) 263 are formed on the second insulating layer 24 as to cover the first openings 241, the second openings 242, and the third openings 243, respectively.

The first lines 261 may include a first organic light-emitting layer, for example, a red organic light-emitting layer.

The second lines 262 may include a second organic light-emitting layer, for example, a green organic light-emitting layer.

The third lines 263 may include a third organic light-emitting layer, for example, a blue organic light-emitting layer.

Also, a counter electrode 252 is formed as to cover the first lines 261, the second lines 262, and the third lines 263. The counter electrode 252 may be a common electrode that is shared by all the pixels P.

The pixel electrode 251 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer formed of silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a transparent layer of ITO, IZO, ZnO, or $In_2O_3$ on the reflective layer. The pixel electrode 251 may be formed by forming a layer by, for example, sputtering, and then patterning the layer by, for example, photolithography.

The counter electrode 252 may also be formed as a transparent electrode or a reflective electrode. When the counter electrode 252 is formed as a transparent electrode, the counter electrode 252 may be used as a cathode. To this end, such a transparent electrode may be formed by depositing a metal having a low work function, such as lithium (Li), calcium (Ca), lithium fluoride/calcium (LiF/Ca), lithium fluoride/aluminium (LiF/Al), aluminium (Al), silver (Ag), magnesium (Mg), or a compound thereof as a thin layer and forming an auxiliary electrode layer or a bus electrode line thereon formed of ITO, IZO, ZnO, $In_2O_3$, or the like. When the counter electrode 252 is formed as a reflective electrode, the reflective layer may be formed by depositing Li, Ca, LiF/Ca, LiF/Al, Al, Ag, Mg, or a compound thereof on the entire surface of the first to the third organic light emitting layers described above. Here, the counter electrode 252 may be formed using the same organic layer deposition apparatus 1 described above.

Functional organic layers may be located between the pixel electrodes 251 and the counter electrode 252 as well as the first lines 261, the second lines 262, and the third lines 263.

The functional organic layers may be formed by stacking one or more of hole injection layer (HIL), hole transport layer (HTL), electron transport layer (ETL), and electron injection layer (EIL).

In embodiments according to the present invention, the first lines 261, the second lines 262, and the third lines 263 are continuously deposited using the organic layer deposition apparatus 1 described above.

That is, as shown in FIG. 2, as the substrate 2 on which the second insulating layer 24 including the first openings 241, the second openings 242, and the third openings 243 is formed passes over the deposition unit 100, where the plurality of organic layer deposition assemblies (100-1) (100-2) . . . (100-n) are located, organic layers including the first lines 261, the second lines 262, the third lines 263, and the functional organic layers are formed on the substrate 2.

Because the formation of the organic layers is continuously performed while scanning in an A direction of an arrow in FIG. 3, the first lines 261, the second lines 262, and the third lines 263 are extended in a first direction D1, which is the same direction as the A direction, as shown in FIG. 12.

Here, among the first lines 261, the second lines 262, and the third lines 263, the first lines 261 and the second lines 262 that are adjacent to each other in a second direction D2, which is perpendicular to the first direction D1, may be partially overlapped with each other on the insulating layer as shown in FIGS. 12 and 13. That is because the substrate 2 and the patterning slit sheet 130 are scanned while they are spaced apart from each other by a certain distance (e.g., a gap), and thus the organic layer being applied has a certain degree of shadow as shown in FIG. 11.

When the first lines 261, the second lines 262, and the third lines 263 are applied by using the same deposition method described above, formation of shadow on the organic layer is generally not avoidable, and thus the first lines 261 and the second lines 262 adjacent to each other in the second direction D2 are partially overlapped with each other, the second lines 262 and the third lines 263 adjacent to each other in the second direction D2 are partially overlapped with each other, and the first lines 261 and the third lines 263 adjacent to each other in the second direction D2 are partially overlapped with each other, as shown in FIGS. 12 and 13.

Here, an overlap region of the first lines 261 and the second lines 262, an overlap region of the second lines 262 and the third lines 263, and/or an overlap region of the third lines 263 and the first lines 261 are formed on the second insulating layer 24.

Also, the first lines 261 through the third lines 263 are not overlapped with openings of other adjacent lines. That is, the first lines 261 are not overlapped with the second openings 242 and the third openings 243 that are respectively covered by the second lines 262 and the third lines 263, which are adjacent to the first lines 261. The second lines 262 are not overlapped with the first openings 241 and the third openings 243 that are respectively covered by the first lines 261 and the third lines 263, which are adjacent to the second lines 262. The third lines 263 are not overlapped with the first openings 241 and the second openings 242 that are respectively covered by the first lines 261 and the second lines 262, which are adjacent to the third lines 263.

Accordingly, mixture of different colors does not occur between the first sub-pixels SP1, the second sub-pixels SP2, and the third sub-pixels SP3 in the described embodiment of the present invention.

In this regard, a distance (e.g., a gap) between the first openings 241, which are arranged along the first lines 261, and the second openings 242, which are adjacent with the first openings 241 in the second direction D2, or a distance between the first openings 241 and the third openings 243 may be, for example, greater than a distance between the second openings 242 and the third openings 243.

That is, when the distance between the first openings 241 and the second openings 242, which are adjacent with the first openings 241 in the second direction D2, is referred to as a first gap G1, the distance between the second openings 242 and the third openings 243, which are adjacent with the second openings 242 in the second direction D2, is referred to as a second gap G2, and the distance between the first openings 241 and the third openings 243, which are adjacent with the first openings 241 in the second direction D2, is referred to as a third gap G3, the first gap G1 or the third gap G3 may be, for example, greater than the second gap G2.

Here, as shown in FIG. 13, the first lines 261 among the first lines 261 through the third lines 263 are deposited first, and then the second lines 262 and the third lines 263 are sequentially deposited on the substrate 2.

Since the first lines 261 are deposited first, the most shadow phenomenon may occur at an edge of the first lines 261 in the second direction when the first lines 261 are deposited. The shadow phenomenon may generate color mixture in the second openings 242 and/or the third openings 243 adjacent to the first lines 261, and thus the first gap G1 or the third gap G3 is greater than the second gap G2 in the embodiment of the present invention to prevent such color mixture.

In general, when color mixture is occurred in blue sub-pixels, a luminance of the blue sub-pixels is reduced to 50% or less.

A width W3 of the third openings 243 may be greater than a width W1 of the first openings or a width W2 of the second openings 242 in order to increase a luminous efficiency of the third sub-pixels SP3, which is blue in the described embodiment of the present invention.

Figure 14:
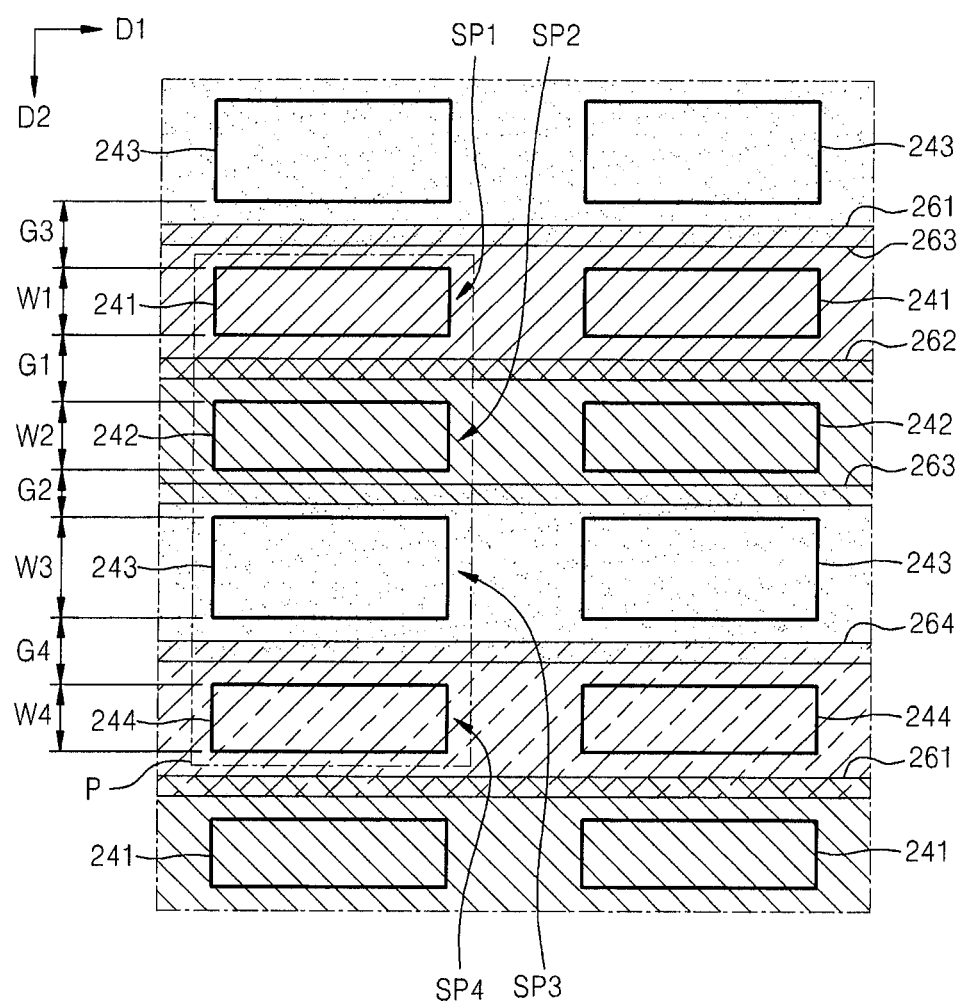
FIG. 14 is a partial plan view of a flat panel display device according to another embodiment of the present invention.

FIG. 14 is a partial plan view of a flat panel display device according to another embodiment of the present invention. In addition to the embodiment of FIGS. 12 and 13, the flat panel display device of FIG. 14 further includes fourth openings 244 formed on the second insulating layer and a plurality of fourth lines 264 including fourth organic light-emitting layer in the first direction D1 as to cover the fourth openings 244.

Fourth sub-pixels SP4 are formed by the fourth lines 264, and thus each pixel P is constructed of the first sub-pixels SP1 to the fourth sub-pixels SP4. The fourth sub-pixels SP4 may emit white light.

When a pixel is formed by sub-pixels of four different colors, a gap between the first openings 241 covered by the first lines 261, which is deposited first, and adjacent openings may be greater than other gaps, and thus color mixture may be reduced or prevented as described above. That is, the first gap G1 or the third gap G3 may be greater than the second gap G2.

The widths W1, W2, W3, and W4 of the first openings 241 to the fourth openings 244 may be different from one another in consideration of a luminous efficiency of a light-emitting material, which is deposited on each of the sub-pixels.

In an embodiment according to FIGS. 12 to 14, the first gap G1 or the third gap G3 is greater than the second gap G2, but is not limited thereto, and all the first to fourth gaps G1 to G4 may have different sizes, thus color mixture caused by a shadow phenomenon at the deposition process may be reduced or prevented as much as possible. The sizes of the first to fourth gaps G1 to G4 may vary depending on an order of deposition, a width of the line, a total pixel size, etc. of each of the lines.

Figure 15:
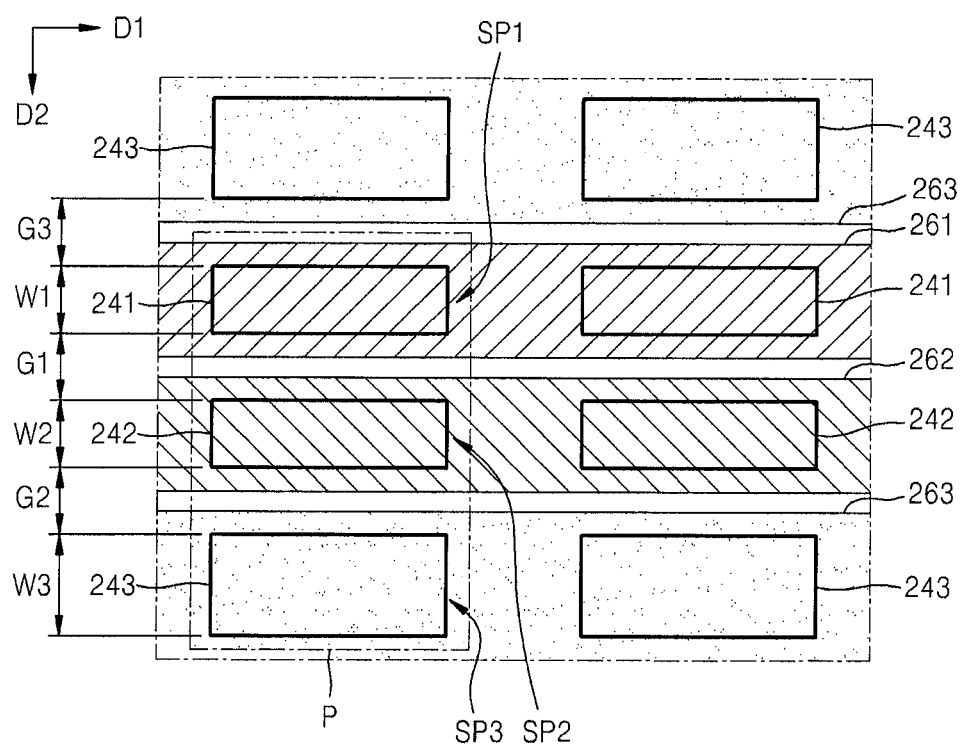
FIG. 15 is a partial plan view of a flat panel display device according to another embodiment of the present invention.

FIG. 15 is a partial plan view of a flat panel display device according to an embodiment of the present invention. In the embodiment of FIG. 15, the first through third gaps G1 to G3 are greater than the width W1 of the first openings 241 in the second direction D2, the width W2 of the second openings 242 of the second direction D2, and the width W3 of the third openings 243 in the second direction D2.

Accordingly, the first lines 261 through the third lines 263 may not be overlapped, and even when the first lines 261 through the third lines 263 are overlapped, color mixture caused by invading up to (e.g., encroaching into or overlapping with) the openings adjacent to the other lines may be prevented.

In the described embodiment of the present invention, the width W3 of the third openings 243 may also be greater than the width W1 of the first openings 241 or the width W2 of the second openings 242 to improve a luminous efficiency of the third sub-pixels SP3, which is blue.

Figure 16:
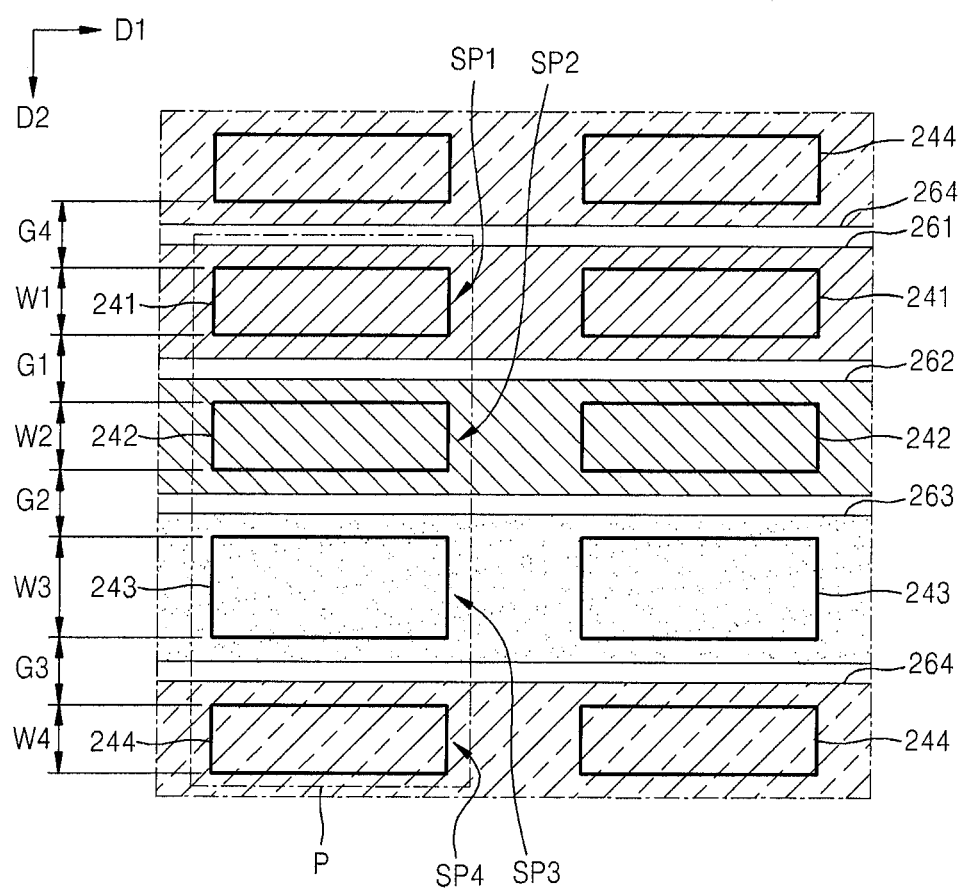
FIG. 16 is a partial plan view of a flat panel display device according to another embodiment of the present invention.

FIG. 16 is a partial plan view of a flat panel display device according to another embodiment of the present invention. In addition to the embodiment of FIG. 15, the flat panel display device of FIG. 16 further includes fourth openings 244 formed on the second insulating layer and a plurality of fourth lines 264 including a fourth organic light-emitting layer in the first direction D1 as to cover the fourth openings 244.

Fourth sub-pixels SP4 are formed by the fourth lines 264, and thus each pixel P is constructed of the first sub-pixels SP1 through the fourth sub-pixels SP4. The fourth sub-pixels SP4 may emit white light.

When a pixel is formed by sub-pixels of four different colors, the first gap G1 or the fourth gap G4 may also be greater than the widths W1 of the first openings 241 in the second direction D2, the with W2 of the second openings 242 in the second direction D2, the width W3 of the third openings 243 in the second direction D2, and the width W4 of the fourth openings 244 in the second direction D2 as described above.

The widths W1, W2, W3, and W4 of the first openings 241 through the fourth openings 244 may be different from one another in consideration of a luminous efficiency of a light-emitting material, which is deposited on each of the sub-pixels.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A flat panel display device comprising:
   a substrate;
   an insulating layer on the substrate, the insulating layer having first openings, second openings, and third openings;
   five first lines on the insulating layer, the five first lines being overlapped with the first openings and extending in a first direction, the five first lines comprising a first organic light-emitting layer;
   a plurality of second lines on the insulating layer, the second lines being overlapped with the second openings and extending in the first direction, the plurality of second lines comprising a second organic light-emitting layer that is different from the first organic light-emitting layer; and
   a plurality of third lines on the insulating layer, the third lines being overlapped with the third openings and extending in the first direction, the plurality of third lines comprising a third organic light-emitting layer that is different from the first and second organic light-emitting layers,
   wherein the five first lines and the second lines, which are adjacent to each other, are partially overlapped with each other on the insulating layer, and the five first lines, the second lines, and the third lines are not overlapped with the openings overlapped with other ones of the lines,
   wherein the flat panel display device comprises five directly adjacent pixels, each comprising a first sub-pixel, a second sub-pixel and a third sub-pixel, wherein a first opening of the first openings, a second opening of the second openings, and a third opening of the third openings are located so as to correspond to the first sub-pixel, the second sub-pixel and the third sub-pixel, respectively, wherein a distance between the first opening and the second opening is different from a distance between the second opening and the third opening, wherein the five first lines are in the five directly adjacent pixels and numbered 1 through 5 in a second direction perpendicular to the first direction;

each of the five first lines having a first shadow on a first side of the line and a second shadow on a second side of the line; and each first shadow satisfying the condition SL1<SL2<SL3<SL4<SL5, where SLi is the first shadow of the ith first line.

2. The flat panel display device of claim 1, wherein the second lines and the third lines, which are adjacent to each other, are partially overlapped with each other on the insulating layer.

3. The flat panel display device of claim 1, wherein the distance between the first opening and the second opening is greater than the distance between the second opening and the third opening.

4. The flat panel display device of claim 1 wherein at least two openings from among the first openings, the second openings, and the third openings have different sizes from each other.

5. The flat panel display device of claim 4, wherein a size of each of the third openings is greater than a size of each of the first openings or a size of each of the second openings.

6. The flat panel display device of claim 1,
wherein the insulating layer has fourth openings, the flat panel display device further comprising a plurality of fourth lines on the insulating layer, the fourth lines being overlapped with the fourth openings and extending in the first direction, the plurality of fourth lines comprising a fourth organic light-emitting layer that is different from the first, second, and third organic light-emitting layers,
wherein:
a distance between a first opening of the first openings and an adjacent second opening of the second openings is a first gap,
a distance between a second opening of the second openings and an adjacent third opening of the third openings is a second gap, and
a distance between a third opening of the third openings and an adjacent fourth opening of the fourth openings is a third gap, and
wherein all the first to third gaps have different sizes.

7. The flat panel display device of claim 6,
wherein a distance between a fourth opening of the fourth openings and an adjacent first opening of the first openings is a fourth gap, and
wherein all the first to fourth gaps have different sizes.

8. A flat panel display device comprising:
a substrate;
an insulating layer on the substrate, the insulating layer having first openings, second openings, and third openings;
five first lines on the insulating layer, the five first lines being overlapped with first openings and extending in a first direction, the five first lines comprising a first organic light-emitting layer;

a plurality of second lines on the insulating layer, the second lines being overlapped with the second openings and extending in the first direction, the plurality of second lines comprising a second organic light-emitting layer that is different from the first organic light-emitting layer; and a plurality of third lines on the insulating layer, the third lines being overlapped with the third openings and extending in the first direction, the plurality of third lines comprising a third organic light-emitting layer that is different from the first and second organic light-emitting layers, the five first lines and the second lines, which are adjacent to each other, are partially overlapped with each other on the insulating layer, and wherein the five first lines, the second lines, and the third lines are not overlapped with the openings that are overlapped with other ones of the lines, and a distance between the first openings and the second openings adjacent to the first openings, a distance between the first openings and the third openings adjacent to the first openings, and a distance between the second openings and the third openings adjacent to the second openings, are greater than widths of the first, second, and third openings along a second direction, which is perpendicular to the first direction wherein the flat panel display device comprises five directly adjacent pixels, each comprising a first sub-pixel, a second sub-pixel and a third sub-pixel, wherein a first opening of the first openings, a second opening of the second openings, and a third opening of the third openings are located so as to correspond to the first sub-pixel, the second sub-pixel and the third sub-pixel, respectively, wherein a distance between the first opening and the second opening is different from a distance between the second opening and the third opening, wherein the five first lines are in the five directly adjacent pixels and numbered 1 through 5 in a second direction perpendicular to the first direction;

each of the five first lines having a first shadow on a first side of the line and a second shadow on a second side of the line; and each first shadow satisfying the condition SL1<SL2<SL3<SL4<SL5, where SLi is the first shadow of the ith first line.

9. The flat panel display device of claim 8, wherein at least two openings from among the first openings, the second openings, and the third openings have different sizes from each other.

10. The flat panel display device of claim 9, wherein a size of each of the third openings is greater than a size of each of the first openings or a size of each of the second openings.

11. The flat panel display device of claim 8, wherein the insulating layer has fourth openings, the flat panel display device further comprising a plurality of fourth lines on the insulating layer, the fourth lines being overlapped with the fourth openings and extending in the first direction, the plurality of fourth lines comprising a fourth organic light-emitting layer that is different from the first, second, and third organic light-emitting layers.

12. A flat panel display device comprising:
a substrate;
an insulating layer on the substrate, the insulating layer having first openings, second openings, and third openings;

five first lines on the insulating layer, the five first lines being overlapped with the first openings and extending in a first direction, the five first lines comprising a first organic light-emitting layer;

a plurality of second lines on the insulating layer, the second lines being overlapped with the second openings and extending in the first direction, the plurality of second lines comprising a second organic light-emitting layer that is different from the first organic light-emitting layer; and a plurality of third lines on the insulating layer, the third lines being overlapped with the third openings and extending in the first direction, the plurality of third lines comprising a third organic light-emitting layer that is different from the first and second organic light-emitting layers, wherein the five first lines and the second lines, which are adjacent to each other, are partially overlapped with each other on the insulating layer, and the five first lines, the second lines, and the third lines are not overlapped with the openings overlapped with other ones of the lines, wherein the flat panel display device comprises five directly adjacent pixels, each comprising a first sub-pixel, a second sub-pixel, and a third sub-pixel, wherein the five first lines are in the five directly adjacent pixels and numbered 1 through 5 in a second direction perpendicular to the first direction;

each of the five first lines having a first shadow on a first side of the line and a second shadow on a second side of the line; and each first shadow satisfying the condition $SL_1 < SL_2 < SL_3 < SL_4 < SL_5$, where $SL_i$ is the first shadow of the $i^{th}$ first line.

* * * * *